US011552653B2

(12) United States Patent
Delfosse et al.

(10) Patent No.: US 11,552,653 B2
(45) Date of Patent: Jan. 10, 2023

(54) UNION-FIND DECODER FOR LDPC CODES

(71) Applicant: Microsoft Technology Licensing, LLC, Redmond, WA (US)

(72) Inventors: Nicolas Guillaume Delfosse, Bellevue, WA (US); Michael Edward Beverland, Seattle, WA (US); Vivien Londe, Paris (FR); Jeongwan Haah, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/187,240

(22) Filed: Feb. 26, 2021

(65) Prior Publication Data

US 2022/0216884 A1    Jul. 7, 2022

Related U.S. Application Data

(60) Provisional application No. 63/134,355, filed on Jan. 6, 2021.

(51) Int. Cl.
*H03M 13/00* (2006.01)
*H03M 13/11* (2006.01)
(Continued)

(52) U.S. Cl.
CPC .......... *H03M 13/116* (2013.01); *G06N 10/00* (2019.01); *G06N 10/70* (2022.01); *H03M 13/1575* (2013.01)

(58) Field of Classification Search
CPC .......... H03M 13/255; H03M 13/1102; H03M 13/116; H03M 13/23; H03M 13/1575; G06N 10/00
See application file for complete search history.

(56) References Cited

U.S. PATENT DOCUMENTS 7,451,292 B2 * 11/2008 Routt ................... H04L 9/0852
                                                        711/212
9,286,154 B2 *  3/2016 Ashikhmin ........ H03M 13/1148
(Continued)

FOREIGN PATENT DOCUMENTS

WO         2019002934 A1     1/2019

OTHER PUBLICATIONS

Anderson, Michaelt. , "Complete Minimal Varieties in Hyperbolic Space", In Journal of Inventiones Mathematicae, vol. 69, Issue 3, Oct. 1982, pp. 477-494.
(Continued)

*Primary Examiner* — Esaw T Abraham
(74) *Attorney, Agent, or Firm* — Holzer Patel Drennan

(57) ABSTRACT

A quantum decoder receives a syndrome from a quantum measurement circuit and performs various decoding operations for processing-efficient fault detection. The decoding operations include generating a decoding graph from the syndrome and growing a cluster around each one of multiple check nodes in the graph that correspond to a non-trivial value in the syndrome. Each cluster includes the check node corresponding to the non-trivial value and a set of neighboring nodes positioned within a distance of d edge-lengths from the check node. Following cluster growth, the decoder determines if, for each cluster, there exists a solution set internal to the cluster that fully explains the non-trivial syndrome bit for the cluster. If so, the decoder identifies and returns at least one solution set that fully explains the set of non-trivial bits in the syndrome.

20 Claims, 18 Drawing Sheets

(51) Int. Cl.
  *H03M 13/15* (2006.01)
  *G06N 10/00* (2022.01)
  *G06N 10/70* (2022.01)

(56) References Cited

U.S. PATENT DOCUMENTS

| | | | |
|---|---|---|---|
| 9,748,976 B2* | 8/2017 | Naaman | H03M 13/157 |
| 9,762,262 B2* | 9/2017 | Ashikhmin | H03M 13/6362 |
| 9,944,520 B2* | 4/2018 | Ashikhmin | B82Y 10/00 |

OTHER PUBLICATIONS

Bravyi, et al., "Tradeoffs for Reliable Quantum Information Storage in 2D Systems", In Journal of Physical Review Letters, vol. 104, Issue 5, Feb. 5, 2010, 4 Pages.

Delfosse, et al., "Linear-Time Maximum Likelihood Decoding of Surface Codes over the Quantum Erasure Channel", In Journal of Physical Review Research, vol. 2, Issue 3, Jul. 9, 2020, 5 Pages.

Delfosse, Nicolas, "Tradeoffs for Reliable Quantum Information Storage in Surface Codes and Color Codes", In Proceedings of the IEEE International Symposium on Information Theory, Jul. 7, 2013, pp. 917-921.

Guth, et al., "Quantum Error Correcting Codes and 4-Dimensional Arithmetic Hyperbolic Manifolds", In Repository of arXiv:1310.5555, Oct. 21, 2013, 21 Pages.

Hatcher, Allen, "Algebraic Topology", Published by Cambridge University Press, 2005, 560 Pages.

Jones, et al., "Complex Functions: An Algebraic and Geometric Viewpoint", Published by Cambridge University Press, Mar. 1987, 12 Pages.

Kitaev, Yua. , "Fault-Tolerant Quantum Computation by Anyons", In Journal of Annals Physics, vol. 303, Issue 1, Jan. 1, 2003, pp. 2-30.

Leverrier, et al., "Quantum Expander Codes", In IEEE 56th Annual Symposium on Foundations of Computer Science, Oct. 17, 2015, pp. 810-824.

Londe, et al., "Golden Codes: Quantum LDPC Codes Built from Regular Tessellations of Hyperbolic 4-Manifolds", In Journal of Computing Research Repository, Dec. 22, 2017, 21 Pages.

Tanner, R.M. , "A Recursive Approach to Low Complexity Codes", In Journal of IEEE Transactions on Information Theory, vol. 27, Issue 5, Sep. 1981, pp. 533-547.

Zemor, Gilles, "On Cayley Graphs, Surface Codes, and the Limits of Homological Coding for Quantum Error Correction", In Proceedings of the International Conference on Coding and Cryptology, Dec. 30, 2008, 15 Pages.

Chao, et al., "Optimization of the Surface Code Design for Majorana-Based Qubits", In Repository of arXiv: 2007.003072, Oct. 26, 2020, 19 Pages.

Delfosse, et al., "Almost-Linear Time Decoding Algorithm for Topological Codes", In Repository of arXiv:1709.06218v1, Sep. 19, 2017, 10 Pages.

Delfosse, et al., "Toward a Union-Find Decoder for Quantum LDPC Codes", In Repository of arXiv:2103.08049v1, Mar. 14, 2021, 28 Pages.

Higgott, et al., "Subsystem Codes with High Thresholds by Gauge Fixing and Reduced Qubit Overhead", In Repository of arXiv:2010.09626v1, Oct. 19, 2020, 29 Pages.

Huang, et al., "Fault-Tolerant Weighted Union-Find Decoding on the Toric Code", In Repository of arXiv:2004.04693v1, Apr. 9, 2020, 6 Pages.

"International Search Report and Written Opinion Issued in PCT Application No. PCT/US2021/053592", dated Feb. 4, 2022, 14 Pages.

Leverrier, et al., "Towards Local Testability for Quantum Coding", In Repository of arXiv:1911.03069v1, Nov. 8, 2019, 38 Pages.

* cited by examiner

UNION-FIND DECODER FOR LDPC CODES

CROSS-REFERENCE TO RELATED APPLICATIONS

The present application claims priority to U.S. provisional application No. 63/134,355, entitled "Union Find Decoder for LDPC Codes," and filed on Jan. 6, 2021 which is hereby incorporated by reference for all that it discloses or teaches.

BACKGROUND

The scalability of decoders for quantum error correction is an ongoing challenge in generating practical quantum computing devices. Hundreds or thousands of high-quality qubits with a very low error rate (e.g., $10^{-10}$ or lower) may be needed to implement quantum algorithms with industrial applications. Using current or near-term quantum technologies, these specifications cannot be met without using thousands of high-quality qubits that are each individually encoded in thousands of physical qubits such that there may exist millions of qubits running each computation of the quantum computer. Obtaining error rates currently required by industrial applications requires correcting, at regular intervals, errors that accumulate over these millions of qubits. Detecting and correcting these errors entails processing a massive amount of data, leading to significant challenges in bandwidth and hardware resource allocation.

Classical Low Density Parity Check (LDPC) codes are ubiquitously used for error identification and correction in modern communication devices, as these codes achieve a high rate of information storage, a large minimum distance allowing for greater error correction capability, and are equipped with a linear time decoder. LDPC codes could bring similar advantages to quantum computing; however, common LDPC decoders such as those using the belief propagation (BP) decoder achieve poor performance in the quantum setting due to the presence of a short cycle in the Tanner graph of quantum LDPC codes. Alternative strategies, such as the flip min set decoder, have been proposed for specific families of quantum LDPC codes; however, these alternative strategies are not universally available to use with all LDPC codes.

SUMMARY

An example fault-tolerant decoder receives a syndrome from a quantum measurement circuit, the syndrome including a plurality of syndrome bits providing information about one or more errors in a qubit register. The fault-tolerant decoder generates a decoding graph from the syndrome that has bit nodes that each correspond to one or more data qubits in the measurement circuit and check nodes that each correspond to one of the syndrome bits. The decoder then grows a cluster around each one of the check nodes corresponding to a non-trivial value in the syndrome, where the cluster includes the check node and a set of neighbor nodes positioned within a distance of d edge-lengths from the check node. Following growth of the cluster(s), the fault-tolerant decoder determines if each of the clusters is neutral (e.g., whether there exists a solution set internal to the cluster that fully explains the non-trivial syndrome value within the cluster). Responsive to determining that all of the clusters are neutral, the union find decoder returns at least one solution set that fully explains the set of non-trivial bits in the syndrome.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Other implementations are also described and recited herein.

DETAILED DESCRIPTION

The herein disclosed technology provides a decoder that can be applied to any stabilizer (e.g., LDPC) code. The decoder makes use of a union-find data structure, also sometimes referred to as a disjoint-set data structure (e.g., a structure that stores a collection of non-overlapping sets) within a Tanner graph to detect and correct errors that occur within a quantum measurement circuit. One implementation of the disclosed technology uses what is referred to herein as a "union-find decoder" to successfully correct errors over small radii using a nearest-neighbor clustering and growth methodology that creates small, localized clusters around non-trivial syndrome bits in which neutral corrections can easily be identified and corrected. By establishing bounds on the covering radius of errors for different classes of quantum LDPC codes, it can be proven that the herein proposed union-find decoder is guaranteed to correct all errors with small covering radius (e.g., errors weight up to $Bn^{\alpha}$ for some B, $\alpha>0$) for all different classes of quantum LDPC codes. Further, numerical simulations have shown that the Union-Find decoder proposed herein outperforms the leading decoder (the "belief propagation" (BP) decoder) in the low error rate regime in the case of a quantum LDPC codes with length 3600.

Figure 1:
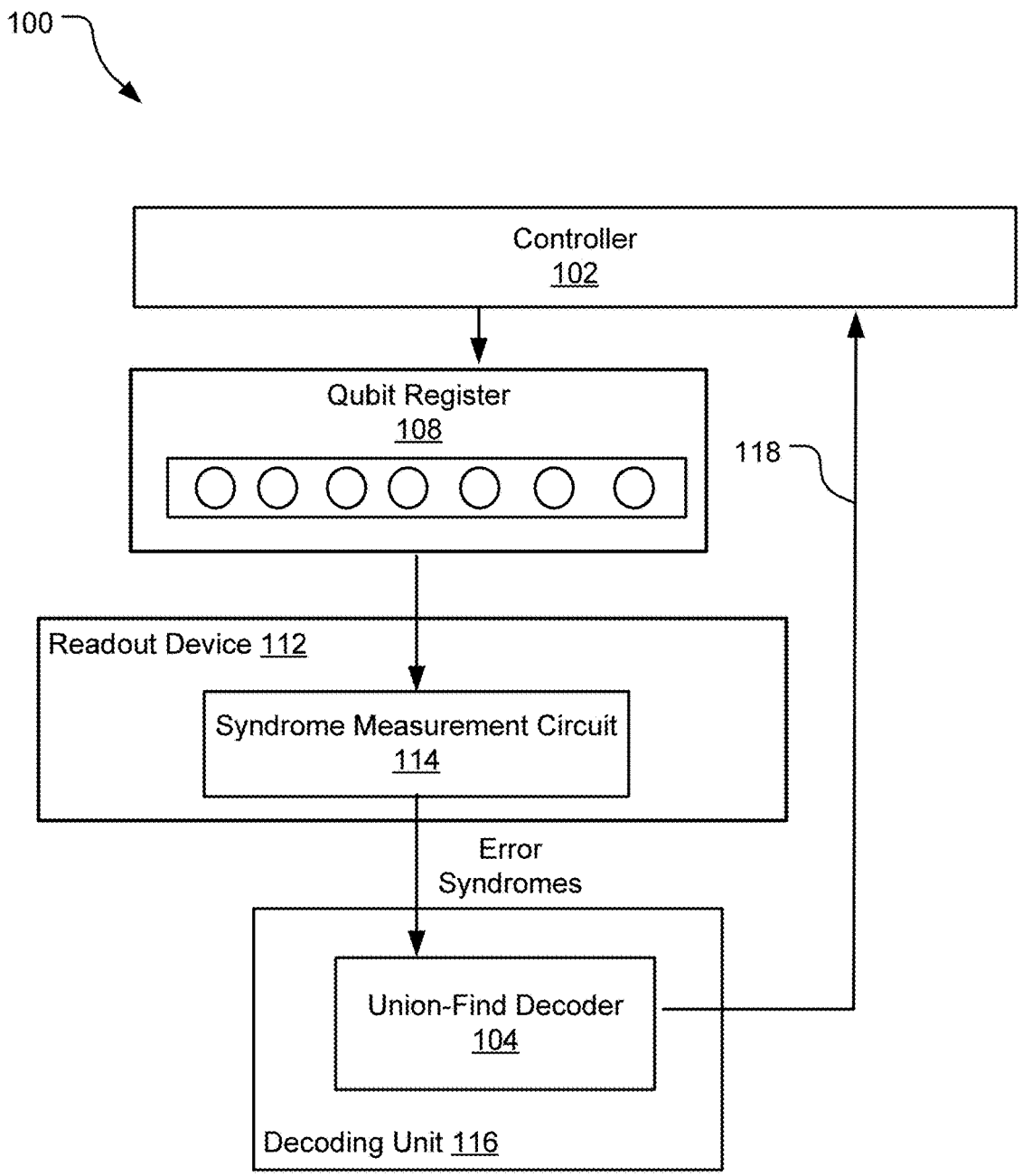
FIG. 1 illustrates an example quantum computing system that implements a Union Find decoder to locate and correct all errors with small covering radius.

FIG. 1 illustrates an example quantum computing system 100 that implements a decoder referred to herein as a Union-Find decoder 104. Two primary implementations of this decoder are discussed herein—both of which utilize similar but slightly different methodologies to perform fault detection. In general, FIG. 2-FIG. 5 below show and describe an LDPC-specific implementation of the Union-Find decoder 104. This decoder provides a universal decoding methodology that is compatible with all LDPC codes and that can be computed with lower overhead than existing solutions. FIG. 6-FIG. 9 introduce a type of code referred to herein as "folded code" or "folded surface code" and a modified version of the Union-Find decoder 104 that provides fault detection in circuit implementations that utilize this folded code.

The quantum computing system 100 includes a controller 102 that performs calculations by manipulating qubits within a quantum register 102. To enable fault tolerant quantum computation in the quantum computing system 100, a readout device 112 includes a syndrome measurement circuit 114 that applies a quantum error correction code (QECC, such as an LDPC code) to the qubits in the qubit register 108. Since measurement is known to destroy the delicate states of a qubit needed for computation, the syndrome measurement circuit 114 uses redundant qubits— known as "ancilla data bits" to perform computations. During quantum processing, entropy from the data qubits that encode the protected data is transferred to the ancilla qubits (sometimes also referred to as "measurement qubits") that can be discarded. The ancilla qubits are positioned to interact with data qubits such that it is possible to detect errors by measuring the ancilla qubits and to correct such errors using a decoding unit 116 that includes one or more decoders. In some implementations, the decoding unit 116 includes logic executed by one or more classical computing systems.

The syndrome measurement circuit 114 performs measurements of the ancilla bits in the quantum computer to extract syndromes providing information measured with respect to errors (faults). In order to avoid accumulation of errors during the quantum computation, the syndrome data is constantly measured, producing r syndrome bits for each syndrome measurement round.

The repeatedly-measured syndrome data is used to identify and track locations of faults that occur throughout a quantum operation that spans several individual qubit manipulations. At the termination of the quantum operation, the measurement circuit performs a final measurement that disentangles one qubit from the others in the measurement circuit 114, and this qubit is read out as a final solution (a 1 or 0 value). By using the syndrome data to track faults in each round of the quantum operation, a classical bit correction can be performed to correct the final solution.

In each round of decoding operation, the syndrome data is sent to the decoding unit 116, which implements logic to analyze the syndrome data and to detect the location of each error and to correct each error within the syndrome measurement circuit 114. Within the decoding unit, the Union-Find decoder 104 receives each round of syndrome data and implements one or more QECCs to analyze the syndrome data at each round of measurement.

In the examples provided in FIG. 2-5, the Union-Find decoder is discussed with respect to the correction of X errors in quantum LDPC codes. The same strategy can be used to correct Z errors by swapping the roles of X and Z.

The Union-Find decoder 104 generates a Tanner graph that includes syndrome nodes and bit nodes, where the syndrome nodes represent each non-trivial syndrome bit returned by the syndrome measurement circuit 114 and the bit nodes correspond to data qubits in the measurement circuit 114. In the case of corrections to X errors, the syndrome bits may be understood as being associated with Z checks. Edges between nodes within the Tanner graph (e.g., the Tanner graph shown in FIG. 2A-2B, discussed below) represent actual connections between each non-trivial syndrome qubit and its directly-connected neighboring data qubits.

The Union-Find decoder 104 works in two basic steps, which may be repeated multiple times to provide a solution set for a single round of measurement. In the first of these two steps, clusters are grown around non-trivial syndrome bits in the Tanner graph. Following cluster growth, the Union-Find LDPC decoder looks for a correction within each of the initial clusters that fully explains the non-trivial syndrome bit of the cluster. If a valid correction cannot be identified for one or more clusters, the cluster(s) lacking valid corrections are said to be "non-neutral" or "charged" and the two-steps are repeated (e.g., by growing the existing clusters to include additional nodes that act as nearest-neighbors one or more qubits within the cluster.

Once a valid correction is identified for all clusters, the clusters are all said to be "neutral." The determined syndrome is then used to perform error correction on the classical counterpart of the qubits residing in the register. For a low-weight error, the correction is guaranteed to succeed if the clusters are small enough.

Example logic of the union-find LDPC decoder 104 is provided with respect to the following figures.

Figures 2A, 2B:
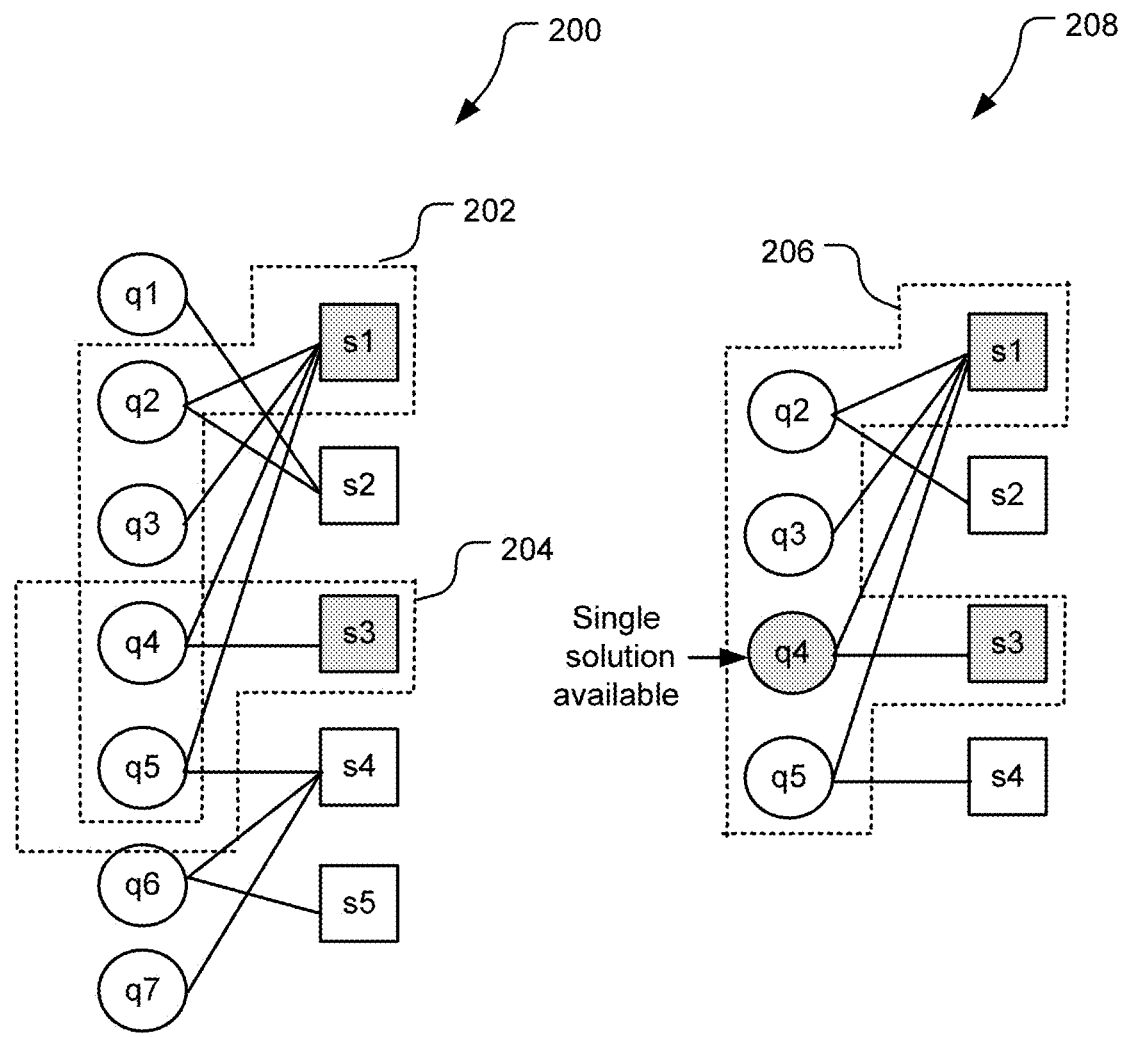
FIG. 2A illustrates aspects of a decoding process performed by a Union-Find decoder using a Tanner graph that has been constructed to represent interconnectivity of qubits in a syndrome measurement circuit.
FIG. 2B illustrates further operations of the decoding process of FIG. 2A.

FIG. 2A-2B illustrate example operations 200 of the union-find decoder 104 of FIG. 1. FIG. 2A illustrates operations 200 of a Union-Find decoder performed using a graph (sometimes referred to as a Tanner graph) that has been constructed to represent interconnectivity of qubits in a syndrome measurement circuit. In the graph 200, square nodes are used to represent syndrome bits in the syndrome measurement circuit (e.g., ancilla qubits that are measured to provide a stabilizer measurement), while circular nodes are used to represent data qubits that are measured by the syndrome. Edges between nodes represent pairs of nearest-neighbor qubits within the quantum measurement circuit. The particular code implemented in the syndrome measurement circuit dictates the number of nodes in the graph 200 and the edge connectivity between the nodes. In FIG. 2, the graph 200 is dramatically simplified for illustrative purposes. Notably, an actual implementation of the graph 200 may have 15,000 or more nodes representing a corresponding number of qubits in a quantum circuit.

In the example illustrated, the syndrome includes five syndrome bits: s1, s2, s3, s4, and s5, each of which are directly coupled to multiple qubits (referred to herein as "nearest neighbor" qubits). In one implementation, the syndrome measurement circuit extracts a syndrome from the data qubits in the qubit register by performing a stabilizer measurement on each set of nearest-neighbor qubits coupled to a different one of the syndrome bits. In the example illustrated, five different stabilizer measurements would be performed to yield a 5-bit syndrome, where each bit in the syndrome is either trivial (e.g., 0, representing the absence of fault) or non-trivial (e.g., 1, representing a fault).

In the example of FIG. 2, trivial syndrome values are returned on s2, s4, and s5. It may be appreciated that the trivial syndrome bits do not necessarily indicate an absence of fault on nearby circuit locations. For instance, in cases where an even number of faults affect a measured ancilla bit, the corresponding measured syndrome bit may appear trivial. Operations for identifying and correcting these types of faults (e.g., even-numbered faults occurring in close proximity) exceed the scope of the present application and are not intended to be handled by the union-find decoder described herein.

Since each syndrome bit value (0 or 1) represents a parity measurement of the data qubits that are nearest-neighbors to the corresponding syndrome bit, the union-find decoder does not initially know exactly which of the data qubits have been affected by the detected faults. All that is known is that these faults either originated at or propagated through the nearest-neighbor qubits of the non-trivial syndrome nodes.

The union-find decoder begins the fault detection process by growing clusters around the nearest neighbor qubits of each of the two non-trivial syndrome nodes s1 and s3. Here, a cluster 202 for s1 includes qubits q2, q3, q4, and q5 while a cluster 204 for s3 includes only q4. Since there is now overlap between these two initial clusters (e.g., q4), the two clusters are merged and the resulting cluster 206 (as shown in FIG. 2B) includes q2, q3, q4, and q4.

FIG. 2B illustrates further operations 208 of the decoding process of FIG. 2A. After the above-described initial cluster growth and cluster merge step, the union-find decoder determines whether resulting cluster(s) are valid. A cluster is herein referred to as "valid" or "neutral" when there exists a correction entirely internal to the nodes of the cluster that fully explains the non-trivial syndrome nodes connected to the cluster. A correction is internal to the nodes of the cluster when the syndrome bits within the cluster are fully explained by identified fault locations in the cluster and when the identified fault locations do not affect (e.g., flip) any syndrome bits external to the cluster. To determine whether the cluster 202 is valid, the union fault decoder looks for a solution within the set of nodes internal to the cluster 202 that explains the non-trivial bit values observed at s1 and s3.

Since q1, q6, and q7 are not part of the cluster 202, these nodes are dropped from the possible solution set. If a fault had occurred at q2, this single fault would have been observed at both s1 and s2. However, since the fault was not observed at s2, q2 is eliminated as a possible solution. If a fault had occurred at q3, this would explain the non-trivial bit observed at s1. However, this possible solution set is incomplete because it does not yet explain the non-trivial bit value observed at s3. If a fault had occurred at either q4 or q5, this would have flipped the bit of s1 from non-trivial to trivial (from 1 to 0), so there is no complete solution set available including q3. Moving on the q4, it can be seen that a single fault at q4 would have indeed resulted in non-trivial syndrome bits at s1 and s3, therefore, q4 represents a valid correction internal to the cluster 202. In this example, q4 represents the only valid solution set. Since it is established that the cluster 202 is valid and there are no invalid (charged) clusters remaining, the union-find decoder may now call an error correction subroutine that corrects the measured qubit dataset identified fault locations.

The above methodology for using the Union-Find decoder (e.g., to correct X errors using Z checks applied via any LDPC code) is formalized in Algorithm 1, in Table 1.0 below.

---

Algorithm 1: Union-Find Decoder for LDPC codes

Input: The syndrome $\sigma = \sigma(x) \subseteq V_C$ of an error $x \subseteq V_Q$.
Output: An estimation $\tilde{x} \subseteq V_Q$ of x. [1] Initialize E as $\tilde{E} = \sigma$. While there exists an invalid connected component in E do: Add the neighbors of E to E, that is $E \leftarrow B_T (E, 1)$. For each connected component $E_i$ of E do: Find a valid correction $\tilde{x}_i \subseteq \text{Int}(E_i)$ such that $\sigma(\tilde{x}_i) = \sigma \cap E_i$. Return $\tilde{x} = \cup_i \tilde{x}_i$.
A set $E \subseteq V$ of vertices of the Tanner graph is said to be a valid for the syndrome $\sigma$ if there exists an error $\tilde{x} \subseteq V_Q \cap \text{Int}(E)$ such that $\sigma(\tilde{x}) = \sigma \cap E$. The condition $\tilde{x} \subseteq V_Q \cap \text{Int}(E)$ ensures that the syndrome $\sigma(\tilde{x})$ of this error is a subset of the set of check nodes of E. If E is valid for the syndrome $\sigma$, an error $\tilde{x}$ that satisfies the validity condition above is said to be a valid correction in E for the syndrome $\sigma$. The following Lemma proves that the validity of a set depends on its connected components. Moreover, the decoder can compute a valid correction $\tilde{x}$ by working independently on the connected components of E.
Lemma: Let $E \subseteq V$ and denote $E = E_1 \cup \ldots \cup E_m$ the decomposition of E into its connected components. Then E is valid iff all of its connected components are valid. Moreover, consider an error $\tilde{x} \subset E$. Then $\tilde{x}$ is a valid correction in E iff for all i = 1, . . . , m, $\tilde{x} \cap E_i$ is a valid correction in $E_i$.
Proof. It suffices to prove the equivalence: $\tilde{x}$ is a valid correction in E iff for all i, $\tilde{x} \cap E_i$ is a valid correction in $E_i$.
Assume $\tilde{x}$ is a valid correction in E and let $\tilde{x}_i = \tilde{x} \cap E_i$. Since $\tilde{x} \subseteq \text{Int}(E)$, we also have $\tilde{x}_i \subseteq \text{Int}(E_i)$. Consider $\sigma_i = \sigma \cap E_i$. Let $\sigma = \sigma(\tilde{x})$ and consider $\sigma_i = \sigma \cap E_i$. By definition of the connected components, the only nodes of $\tilde{x}$ that are at distance ≤2 from a node of $\sigma_i$ are in $E_i$, that is in $x_i$. Moreover, $\sigma(\tilde{x}_i) \subseteq E_i$. As a result, we have $\sigma(\tilde{x}_i) = \sigma_i$. This proves that $\tilde{x}_i$ is a valid correction in $E_i$. The converse implication can be proven with the same argument.

---

The methodology introduced in Algorithm 1 and the above description is explored further with respect to FIG. 3A-4D.

FIG. 3A-3D illustrate further example operations of a union-find decoder that identifies fault locations affecting syndrome measurement received from a syndrome measurement circuit.

Figures 3A, 3B:
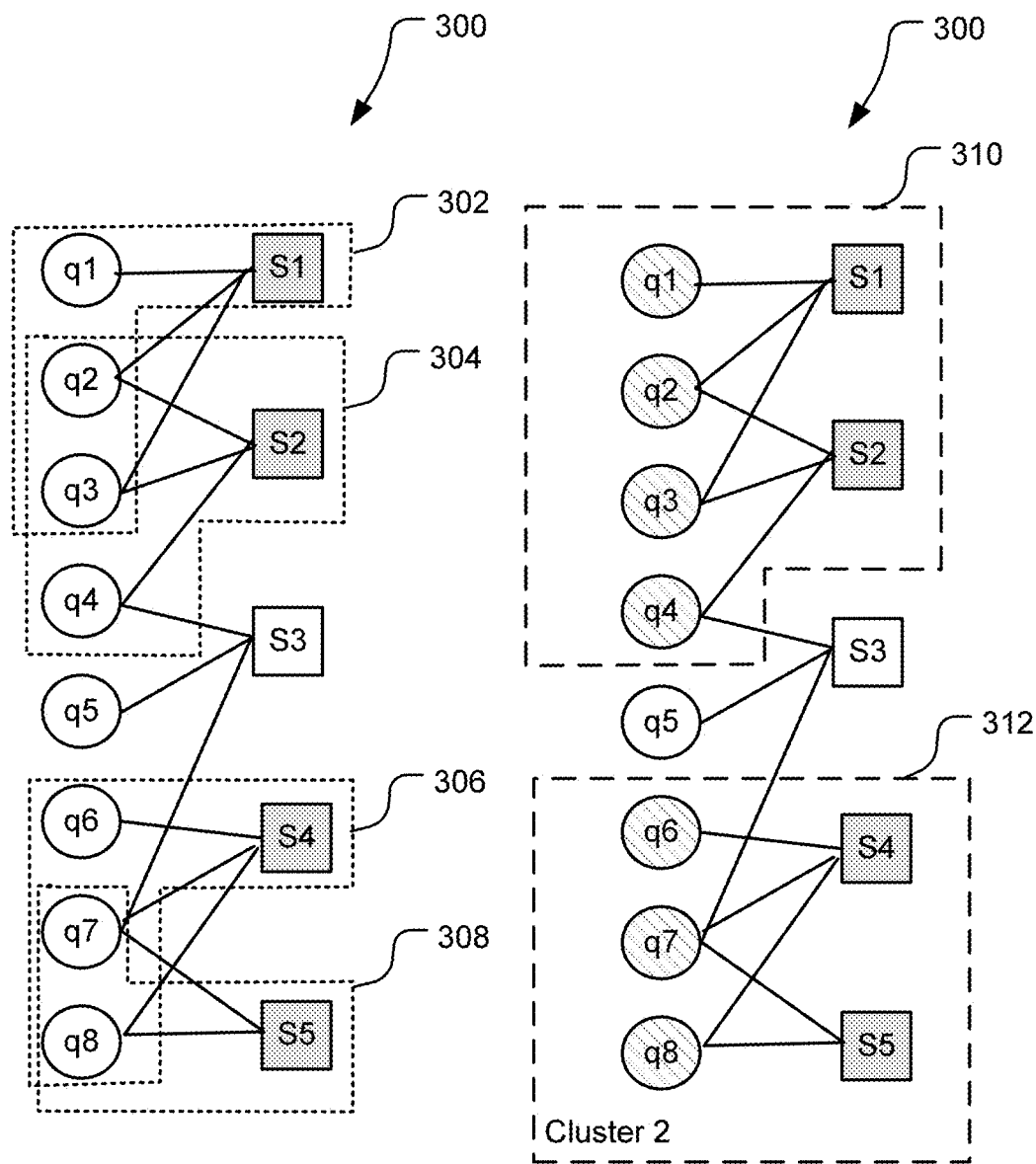
FIG. 3A illustrates another example Tanner graph depicting a syndrome measurement performed by a syndrome measurement circuit.
FIG. 3B illustrates the Tanner graph of FIG. 3A modified to include exemplary clusters resulting from decoding operations described above with respect to FIG. 3A.

FIG. 3A illustrates another example Tanner graph 300 representing qubits and connections between qubits within a syndrome measurement circuit. The Tanner graph 300 includes syndrome bits (squares), data bits (circles), and connections therebetween (edges). In the example illustrated, the syndrome again includes five syndrome bits: s1, s2, s3, s4, and s5. In a single measurement round (e.g., of Z checks applied by measuring a Z stabilizer), a trivial syndrome value is returned on s3, but non-trivial syndrome values are returned on s1, s2, s3, and s4. As in the above example, the union-find decoder does not initially know exactly which of the data qubits have been affected by the detected faults. All that is known is that these faults either originated at or propagated through the nearest-neighbor qubits of the non-trivial syndrome nodes s1, s2, s3, an s4.

Applying the operations of Algorithm 1, above, the Union-Find decoder begins the fault detection process by growing clusters around the nearest neighbor qubits of each of the two non-trivial syndrome nodes. This results in a first cluster 302 around s1 and its nearest-neighbor qubits q1, q2, q3; a second cluster 304 around s2 and its nearest neighbor qubits q2, q3, q4; a third cluster 306 around s4 and its neighboring qubits q6, q7, q8; and a fourth cluster 308 around s5 and its nearest-neighbor qubits q7 and q7. Since there is node overlap between cluster 302 and cluster 304 (e.g., q2 and q3), these clusters are merged into cluster 310 (shown in FIG. 3B). Likewise, since there is overlap between cluster 306 and 308, these two clusters are merged into another cluster, 312 (also shown in 3B). Now, the initial cluster-growing phase is complete and there exist two clusters 310 and 312, which are independent of one another (e.g., do not contain any individual nodes that are included in both clusters).

FIG. 3B illustrates the Tanner graph 300 modified to include clusters 310 and 312 resulting from the operations described above with respect to FIG. 3A. In a subsequent step of the operations described with respect to FIG. 3A and Algorithm 1, the Union-Find decoder determines whether the two clusters 310 and 312 are neutral. That is, is decoder determines whether there exists solution internal to either cluster that fully explains the syndrome within it. In the illustrated example, the decoder determines that each of the clusters 310 and 312 is neutral because there exists at least one valid correction for each cluster. In the example illustrated, there are actually two valid corrections for each of clusters 310 and 312. These corrections are identified in FIG. 3C.

Figure 3C:
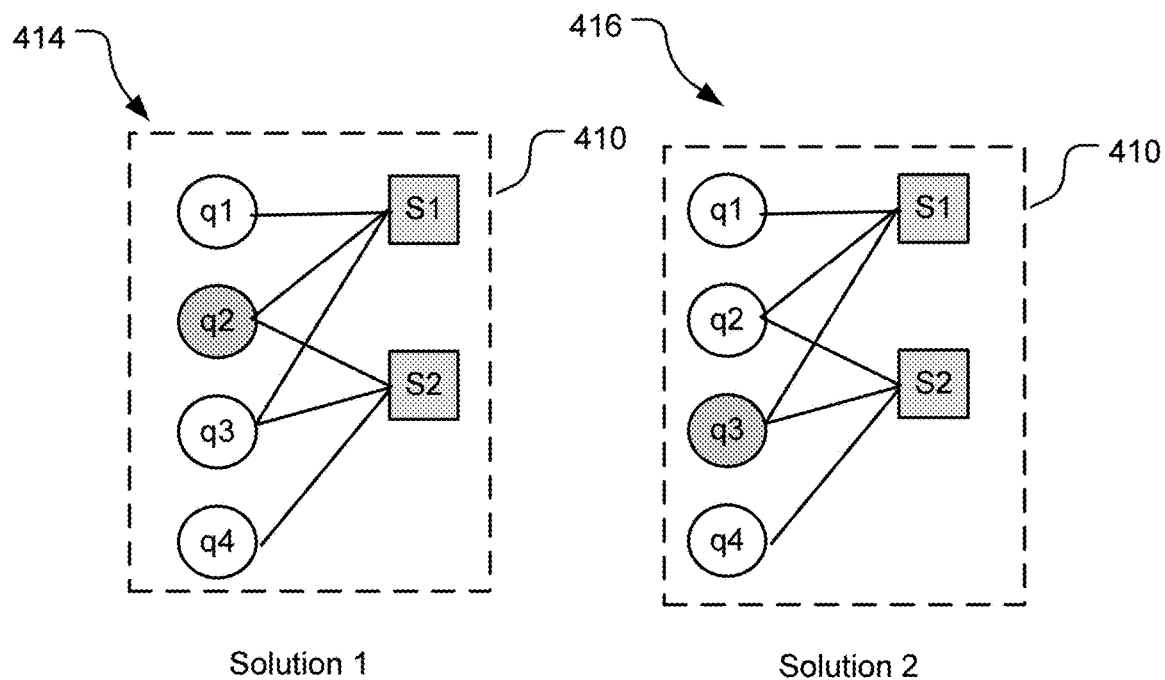
FIG. 3C illustrates exemplary valid solutions that explain non-trivial bits in a syndrome that are depicted by the Tanner graph shown in FIG. 3A-3B.
Figure 3C:
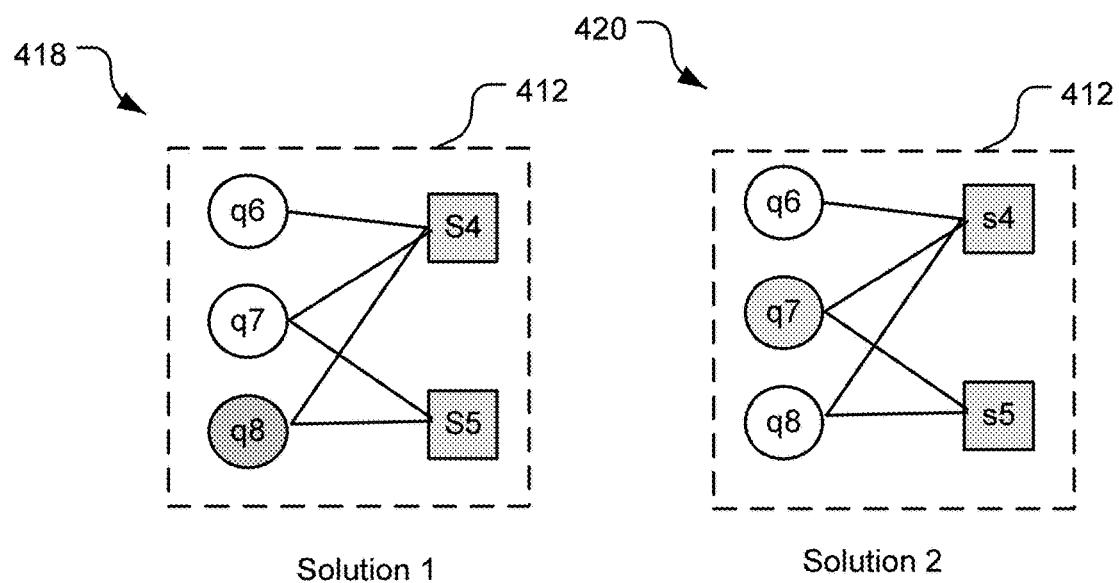

FIG. 3C illustrates exemplary valid solutions that explain non-trivial bits in a syndrome that are depicted by the Tanner graph shown in FIG. 3A-3B. A first graph structure 314 (top left) illustrates one example valid correction to the cluster 310 (e.g., a fault located at q2). Another graph structure 316 (top right) illustrates a second valid correction to the cluster 310. The cluster 312 also has two valid corrections. A first one of these two corrections is shown by graph structure 316 (bottom left) while a second one of these two corrects is shown the by graph structure 318 (bottom right). The Union-Find decoder selects one of the available valid solutions for the cluster 310 and one of the valid solutions for the cluster 312 and calls an error correction subroutine to implement a classical correction to the data qubits affected by the identified faults that facilitates a subsequent correction of a final output of the quantum operation (e.g., the final output of the readout device).

In the above example, it is assumed that the two solutions for cluster one are trivial variants of one another (e.g., meaning that the fault locations in each solution may be captured by a same stabilizer measurement in the actual code). Thus, it does not matter which of the valid solutions the union-find decoder uses to perform error correction. Since valid corrections have been identified for each independent cluster, the union-find decoder has finished its computation. A subroutine may be called to classically correct the errors at the identified fault locations.

FIG. 4A-4D illustrate still further example operations of a Union-Find decoder that identifies fault locations affecting syndrome measurement received from another syndrome measurement circuit. This example varies from the example of FIG. 2 in that the specific locations of the faults are such that one of the two clusters is not neutral (still charged, without a valid solution) after the initial round of growth.

Figure 4A:
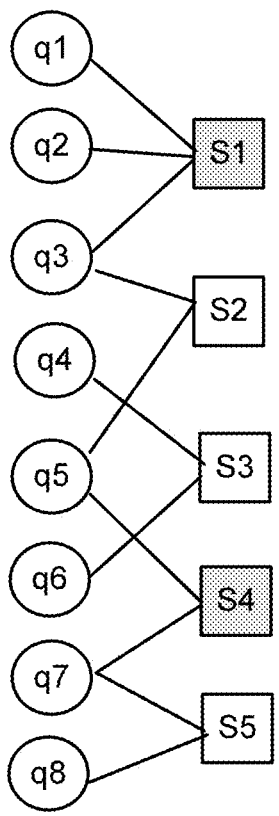
FIG. 4A illustrates another example Tanner graph depicting a syndrome measurement performed by a syndrome measurement circuit.

FIG. 4A illustrates an example Tanner graph 400 generated for a syndrome measurement circuit where non-trivial syndrome values have been observed two of five syndrome nodes, s1 and s4.

Figure 4B:
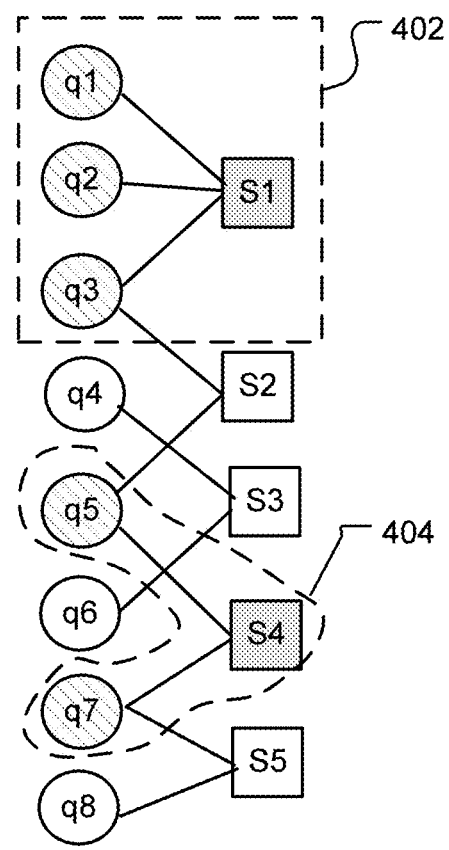
FIG. 4B illustrates the Tanner graph of FIG. 4A modified to include exemplary clusters resulting from initial decoding operations of a Union-Find decoder.

FIG. 4B illustrates the Tanner graph of FIG. 4A modified to include exemplary clusters resulting from initial decoding operations of a Union-Find decoder. As shown, the union-find decoder grows a cluster 402a around s1 and its nearest-neighbor qubits q1, q2, and q3. The Union-Find decoder grows another cluster 404a around s4 and its nearest-neighbor qubits q5 and q6.

After this initial growth stage, the Union-Find decoder determines whether all clusters are neutral. Here, the cluster 402a is a neutral cluster with two valid solutions—a fault on either q1 or 2 is sufficient to explain the non-trivial syndrome s1 without affecting any qubits not included in the cluster. However, at the same point in time, the cluster 404 remain charged (non-neutral). A fault on q5 would have affected the syndrome node s2, which is external to the cluster 404a and therefore, not a valid correction. Likewise, a fault on q7 would have affected the syndrome node s5, which is external to the cluster 404a and not a valid correction.

Figure 4C:
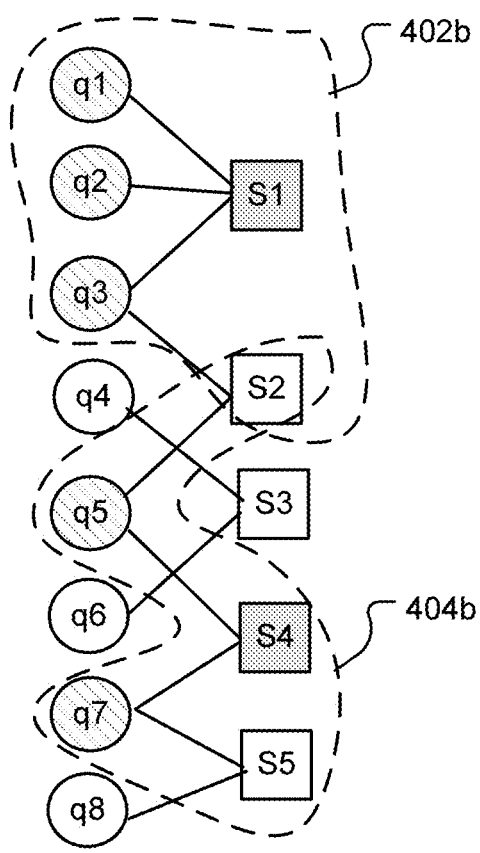
FIG. 4C illustrates the Tanner graph of FIG. 4A-4B further modified to include exemplary clusters resulting from further decoding operations of the Union-Find decoder following the operations of FIG. 4B.

Because there are no valid corrections for the cluster 404a, the union-find decoder performs a second cluster growth stage shown in FIG. 4C.

FIG. 4C illustrates the Tanner graph of FIG. 4A-4B further modified to include exemplary clusters resulting from further decoding operations that include the above-mentioned second cluster growth stage. In this second growth stage, all clusters (e.g., both cluster 402a and 404a) are grown to include all syndrome nodes (squares) that are nearest nearest-neighbor nodes to the data qubits (circuit) already in the cluster. The cluster 402a is grown to additionally include syndrome node s2, which is a nearest-neighbor node to q3. The expansion of the cluster 402a results in a modified cluster 402b. Likewise, the cluster 404a is grown to additionally include syndrome nodes s2 and s5, which are nearest-neighbor nodes to q5 and q7, respectively. This expansion of the cluster 404a results in a modified cluster 404b.

Figure 4D:
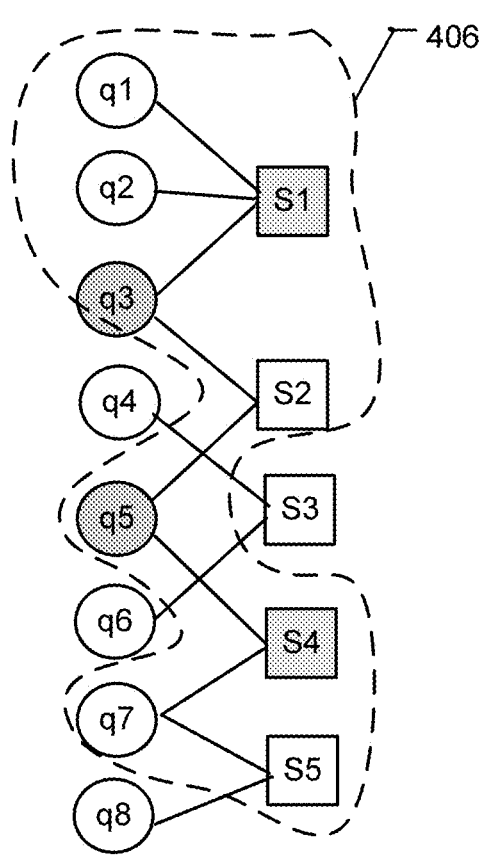
FIG. 4D illustrates a single cluster that is formed via the example decoding operations described with respect to FIG. 4A-4C.

After the secondary cluster growth step shown in FIG. 4C, the two expanded clusters 402b and 404b overlap one another (e.g., s2 is included in both); consequently, the expanded clusters 402b and 404b are merged into a single cluster 406, FIG. 4D illustrates a single cluster that is formed via the example decoding operations described with respect to FIG. 4A-4C. Following the above-described cluster growth and merge steps, the union find decoder determines whether the resulting independent clusters are all neutral. Here, there is only one resulting independent cluster—cluster 406, and this cluster is neutral because the non-trivial values observed at s2 and s4 can be fully explained by faults at q3 and q5, and the solution is completely internal to the cluster 408. (Note: the fault on q3 and q5 would have caused two faults at s2 to cancel one another out, which agrees with the trivial syndrome observed at s2. At this point, the union find decoder has found a valid correction to all independent clusters and there are no non-neutral (charged) clusters remaining. Thus, the union find decoder has finished its computation. A subroutine may now be called to classically correct the errors at the identified fault locations.

Union-Find Decoder for Correction of Errors with Small Covering Radius

The Union-Find decoder introduced above can be applied to any stabilizer code. However, it is unlikely to identify the right correction for some codes, such as a general code defined by large weight checks, because the Union-Find cluster grow too fast and may cover the whole Tanner graph after only a few growth grounds. This is, surprisingly, not the case with LDPC codes—including those LDPC codes with Tanner graphs that exhibit expansion. Below, the notion of a covering radius is generally introduced along with a mathematical proof demonstrating that if the covering radius of errors is small enough, the Union-Find decoder successfully corrects all low-weight errors.

The covering radius of an error (x) with a particular syndrome (a) is defined to be the minimum integer (r) such that the r-neighborhood of the syndrome a in the Tanner graph (T) covers x, that is the covering radius:

$$\rho_{cov}(x) = \min\{r \in N | x \subseteq B(\sigma, r)\} \quad (1)$$

If the syndrome of x is trivial (e.g., 0), we defined the covering radius $\rho_{cov}(x) = 0$. The following proposition in Table 2.0 below provides that the Union-Find decoder successfully corrects all error with weight less than a polynomial in d if their covering radius is small enough. This result is proven for the Union-Find decoder with uniform growth which grows all invalid simultaneously during a round of growth. Notably, some implementations may grow clusters individually (e.g., sequentially) rather than simultaneously during a round a growth. An example of this is explored below with respect to FIG. 10 (e.g., growth operation 1014, discussed below with respect to FIG. 10 discussion).

TABLE 2.0

Proposition: Consider a stabilizer code with minimum distance d whose Tanner graph has bounded degree δ. Assume that there exist constants ω and C such that $\rho_{cov}(x) \leq C\log(|x|)$ for all errors x with weight $|x| < \omega$. Then, the Union-Find decoder (Algorithm 1 in Table 1) successfully corrects errors with weight $|x| < \min(\omega, Ad^\alpha)$ where $$\frac{1}{1 + C\log(\delta)} \text{ and } A = \left(\frac{1}{2\delta^2}\right)^\alpha.$$

Proof. Consider an error x such that $|x| < \min(w, Ad^\alpha)$ and let $\sigma = \sigma(x)$. By definition of the covering radius, we are guaranteed to obtain a set of valid connected components in Algorithm 2 after at most $\overline{\rho}_{cov}(\sigma)$ growth steps. This proves that the correction is contained within $E \subseteq \cup_{s \in \sigma} B_T(s, \overline{\rho}_{cov}(\sigma))$, where the decomposition is over each vertex in the syndrome σ of x. Taking the cardinality on both sides, we obtain $|E| \leq |\sigma| \cdot \delta^{1 + \sigma_{cov}(\sigma)}$ where δ is the degree of the Tanner graph. Moreover, the weight of the syndrome is at most δ|x|. This proves that
$|E| \leq \delta^2 |x| \delta^{\rho_{cov}(\sigma)} \leq \delta^2 |x|^{1 + C\log(\delta)}$.
The Union-Find decoder returns a correction $\tilde{x}$ included in E. After correction, the residual error $x + \tilde{x}$ (which has trivial syndrome) satisfies
$|x + \tilde{x}| \leq |x| + |E| \leq 2\delta^2 |x|^{1 + C\log(\delta)} < 2\delta^2 (Ad^\alpha)^{1 + C\log(\delta)} = d$.
This proves that the decoder succeeds since the residual error has weight < d, and therefore must be a stabilizer.

Alternate implementations of the Union-Find decoder are discussed with respect to the remaining figures. These figures and the associated description propose adaptations to the above-described methodology to allow for decoding in circuits that can be represented by a type of code referred to herein as "folded code," which is a particular application of an LDPC code known as "Surface Code." Below, the basic concepts of surface code are reviewed with respect to FIG. 5. Folded code implementations of the surface code are then introduced with respect to FIG. 6A-FIG. 8, and folded-code implementations of the Union-Find decoder are presented with respect to FIG. 9A-9D.

Overview of Traditional (Unfolded) Surface Code

Figure 5:
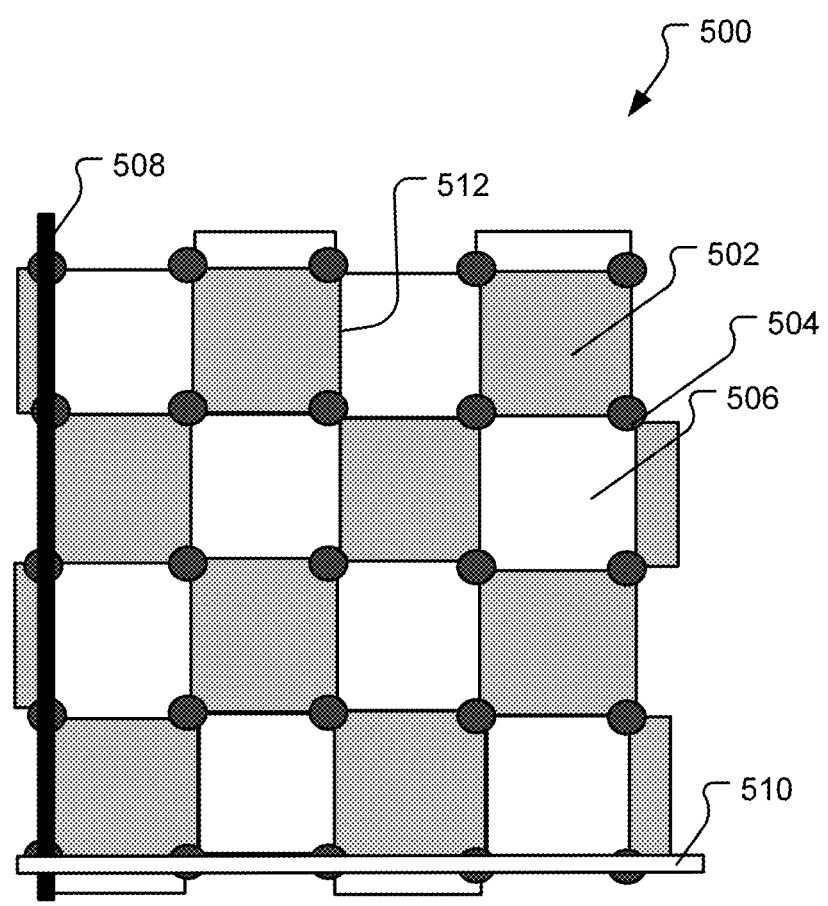
FIG. 5 illustrates an example patch of surface code that may be implemented by a syndrome measurement circuit.

FIG. 5 illustrates an example patch 500 of surface code that may be implemented by a syndrome measurement circuit. The surface code is an example of an LDPC code. By example and without limitation, the surface code considered in FIG. 5 is a 45 degree rotated version of the standard toric code with certain boundary conditions. The patch 500 of surface code includes a checkerboard pattern of plaquettes (e.g., a plaquette 502) with corners (nodes such as node 504) corresponding to qubits in the syndrome measurement circuit. Each edge (e.g., an edge 512) interconnecting a pair of nodes represents a physical connection between qubits corresponding to the nodes.

A syndrome measurement circuit may typically include many different patches similar to the patch 500 arranged in a grid-like pattern, where the data encoded within each individual patch represents one logical quit. The logical qubit of the patch 500 is encoded in a combination of data qubits, represented by filled circles (e.g., a data qubit 504) arranged at the corners of plaquettes. Each plaquette represents a stabilizer measurement that may be performed on the associated data qubits forming the corners of that plaquette. Stabilizers are widely known and used in quantum computations. The stabilizer measurement is used to determine a parity of the associated data qubits without direct measurement of their qubit states, which would destroy the corresponding data. In one implementation, an ancilla qubit (not shown) is positioned at the center of each plaquette. In this architecture, the stabilizer measurement entails entangling the four corner data qubits with the stabilizer via a sequence of CNOT operations, followed by a measurement of the ancilla qubit in the Z or X basis. In other implementations, stabilizer measurements are realized via other known mechanisms without the use of ancilla qubits.

A syndrome measurement circuit implementing surface code may utilize two types of ancilla qubits referred to herein respectively as "measure-Z" qubits (centered on plaquettes with shaded faces, such as shaded plaquette 502) and "measure-X" qubits (centered on plaquettes with unshaded faces, such as unshaded plaquette 506), where each measure-X and measure-Z qubit is coupled to four data qubits (e.g., the four data qubits at the corner of the plaquette). Further, each data qubit (e.g., each filled solid circle) is coupled to two measure-Z qubits and two measure-X qubits (e.g., the four nearest solid filled circles).

A measure-Z qubit is used to force is used to force its neighboring data qubits a, b, c, and d into an eigenstate of the operator product $\hat{Z}_a, \hat{Z}_b, \hat{Z}_c, \hat{Z}_d$. Likewise, a measure-X qubit is used to force is used to force its neighboring data qubits a, b, c, and d into an eigenstate of the operator product $\hat{X}_a, \hat{X}_b, \hat{X}_c, \hat{X}_d$. Each measure-Z qubit therefore measures what is known as a Z-stabilizer and each measure-X qubit measures what is known as an X-stabilizer. Stabilizers (e.g., the X-stabilizer and the Z-stabilizer) are very important in preserving quantum states. By repeatedly measuring a quantum system using a complete set of commuting stabilizers, the syndrome measurement circuit forces the data bits associated with each measure-X and measure-Z qubit into a simultaneous and unique eigenstate of all of the stabilizers allowing one to measure the stabilizers without perturbing the system. When the measurement outcomes change, this corresponds to one or more qubit errors and the quantum state is projected by the measurements onto a different stabilizer eigenstate.

During a single measurement of all measure-X and measure-X qubits in the surface code graph (e.g., with patch 500), a syndrome S is extracted where S is a three-dimensional array of 0 and 1 value representing whether or not an error has been detected at the plaquette corresponding to the measurement. In general, a trivial syndrome ('0') indicates non-detection of a fault at the corresponding circuit location while a non-trivial syndrome ('1') indicates that a fault has been detected at the corresponding circuit location.

As further background, a black line 508 and a white line 510 are shown to signify two sets of representatives of available logical operators for the patch 500. The X-logical operator of the patch 500 can be determined by taking the tensor product of the data qubits along any column (e.g., along the black line 508) and the Y-logical operator of the patch 500 can be determined by taking the tensor product of the data qubits along any row (e.g., along the white line 510). The surface code patch 500 is said to have distance "d" equal to the number of qubits along each row and column (e.g., in FIG. 5, d=5).

Folded Surface Code

Figure 6A:
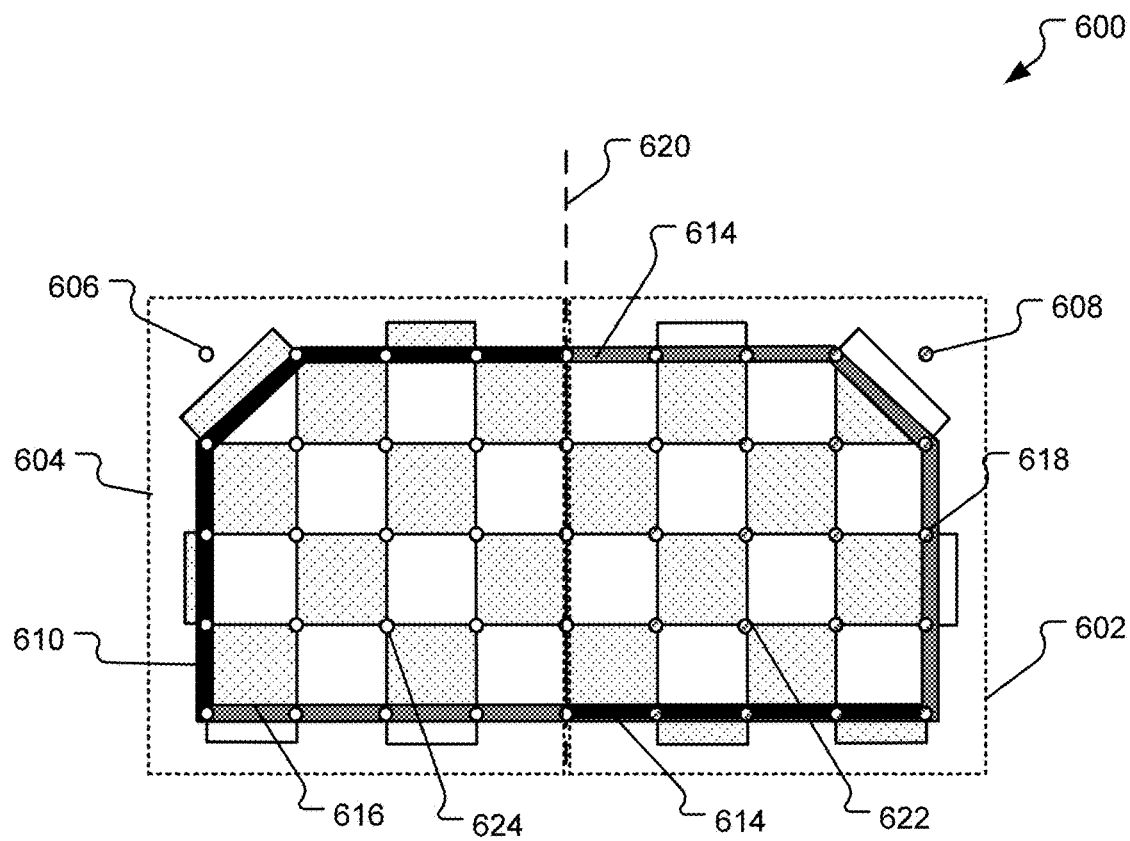
FIG. 6A illustrates an example wide surface code patch that is part of a foundational architecture for a type of code referred to herein as "folded surface code" or merely, folded code.

FIG. 6A illustrates an example wide surface code patch 600 that is part of a foundational architecture for a type of code referred to herein as "folded surface code" or merely, folded code. In FIG. 6A, the wide surface code patch 600 is shown in an unfolded configuration. The wide surface code patch 600 may be conceptualized as including adjoined sub-patches 602, 604, with characteristics similar to those described above with respect to FIG. 5. Unlike FIG. 5, however, the qubits at the top-most left corner and top-most right corner (e.g., qubits 606, 608) of the wide surface code patch 600 have been omitted from the corresponding corner plaquette stabilizer measurements in order to cause the associated logical operators to wrap around (rather than terminate at) the corner, as shown. Since the sub-patches 602 and 604 are adjoined by way of stabilizer measurements effecting entanglements across the length of the wide surface code patch 600, the X-logical operator of the wide surface code patch 600 can be measured by taking the tensor product of qubits along either of the black lines 610, 614, while the Z-logical operator of the wide surface code patch 600 can be measured by taking the tensor product of qubits along either of the grey lines 616, 618.

Observe that this code is symmetric under the reflection about the center vertical line 620 up to interchanging of the logical operators X and Z. When the wide surface code patch 600 is folded back on itself at the center vertical line 620, the two sub-patches 602, 604 become stacked and their corresponding data qubits may be understood as coexisting in the same plane or otherwise positioned in local proximity such that pairs of qubits occupy the same "site" That is, data qubits in the sub-patch 602 represented by hollow circles each share a site location with a corresponding one of the data qubits in the sub-patch 604. For example, the qubits 622, 624 share a same site when the wide surface code patch 600 is folded in half.

Figure 6B:
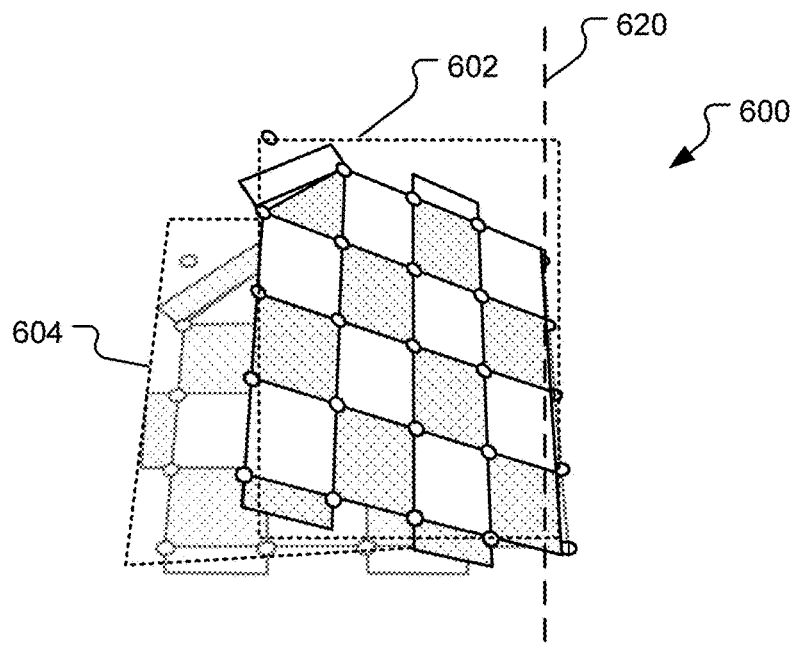
FIG. 6B illustrates the wide surface code patch of FIG. 6A in a folded configuration.

FIG. 6B illustrates the wide surface code patch 600 of FIG. 6A in a folded configuration. The patch 602 is folded over a vertical central line 620 so as to overlap the sub-patch 604. Here, every pair of mirroring qubits not on the vertical central line 620 lie on top of one another and are said to occupy a same site. The doubly-occupied sites can be realized naturally in some types of hardware. For instance, a hexon is a system of Majorana wires with 6 Majorana zero modes where the overall fermion parity is contsrained to the charging energy, leaving a 4-fold degenerate ground state subspace. In a hexon-type architecture, each hexon encodes two qubits that may be liked to a pair of qubits sharing a site on within the folded implementation of the side surface code patch 600. Alternatively, the system of doubly occupied sites may be realized by long interaction channels between every mirror pair of qubits.

A logical operator is implemented transversely in the folded code if the operator is a tensor product of unitaries which each act only on a pair of qubits in the same site or a single qubit on the central vertical line 620.

Figure 6C:
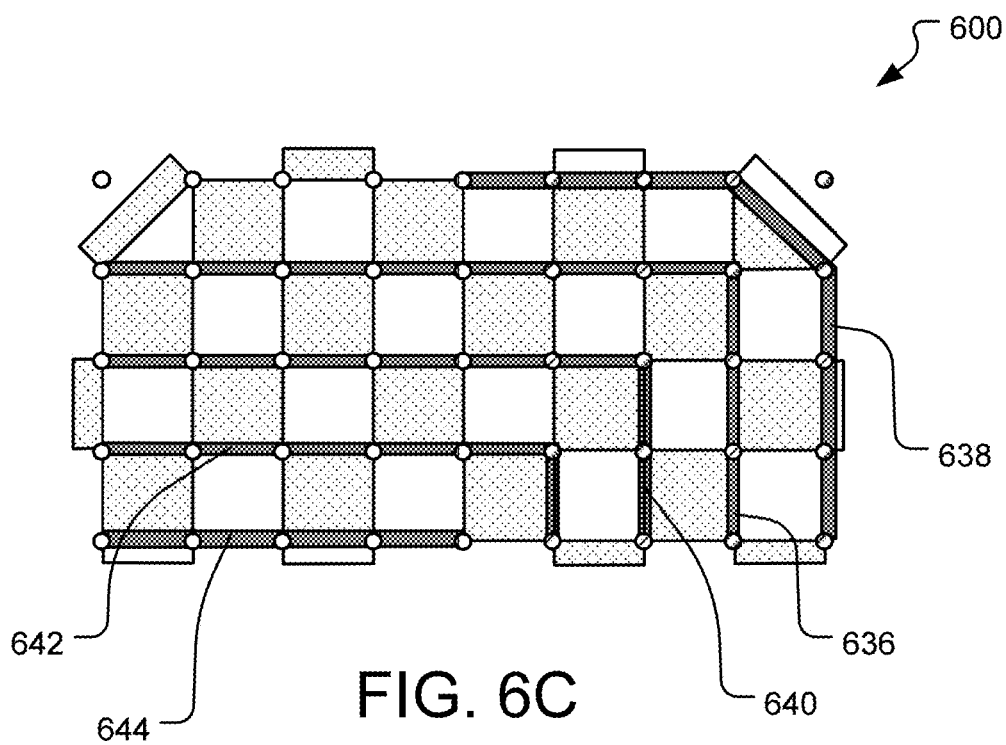
FIG. 6C illustrates another representation of the wide surface code patch of FIG. 6A-6B shown in the unfolded configuration.

FIG. 6C illustrates another representation of the wide surface code patch 600 in the unfolded configuration. From this figure, it can be seen that the folded distance of the folded code is equal to the standard code distance d (where d=5 in the present example). Here, the wide surface code patch is further annotated with dark lines 636, 638, 640, 642, 644 that are d disjoint representatives of the X-logical operator, all of which any Z-logical operator must intersect.

Figure 6D:
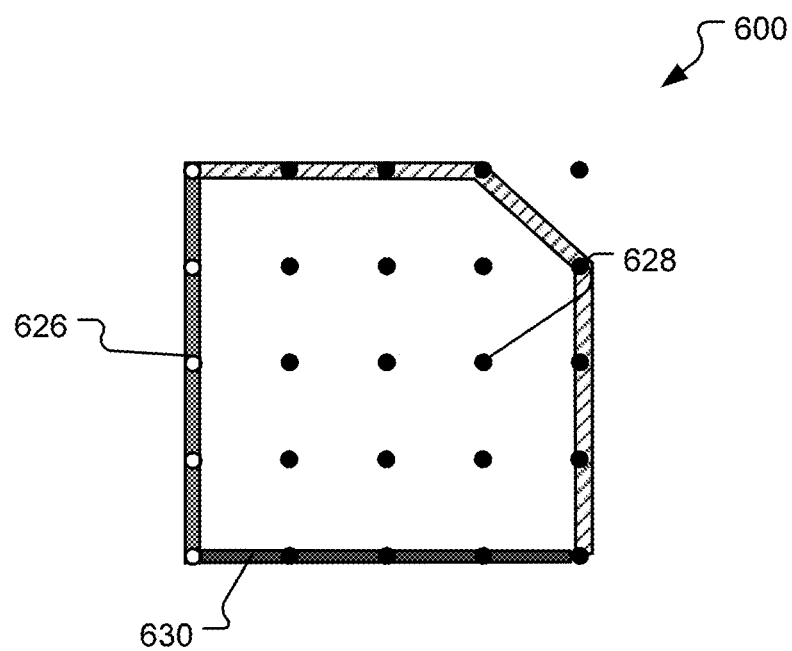
FIG. 6D illustrates still another representation of the wide surface code patch of FIG. 6A-6D in the folded configuration.

FIG. 6D illustrates still another representation of the wide surface code patch 600 in the folded configuration. Here, hollow circles (e.g., a hollow circle 626) are used to represent sites that are occupied by single qubits and filled circles (e.g., a filled circle 628) are used to represent sites that are occupied by a pair of qubits. Upon folding, any Z logical operator's support contains a path represented by the line 630.

Figure 7:
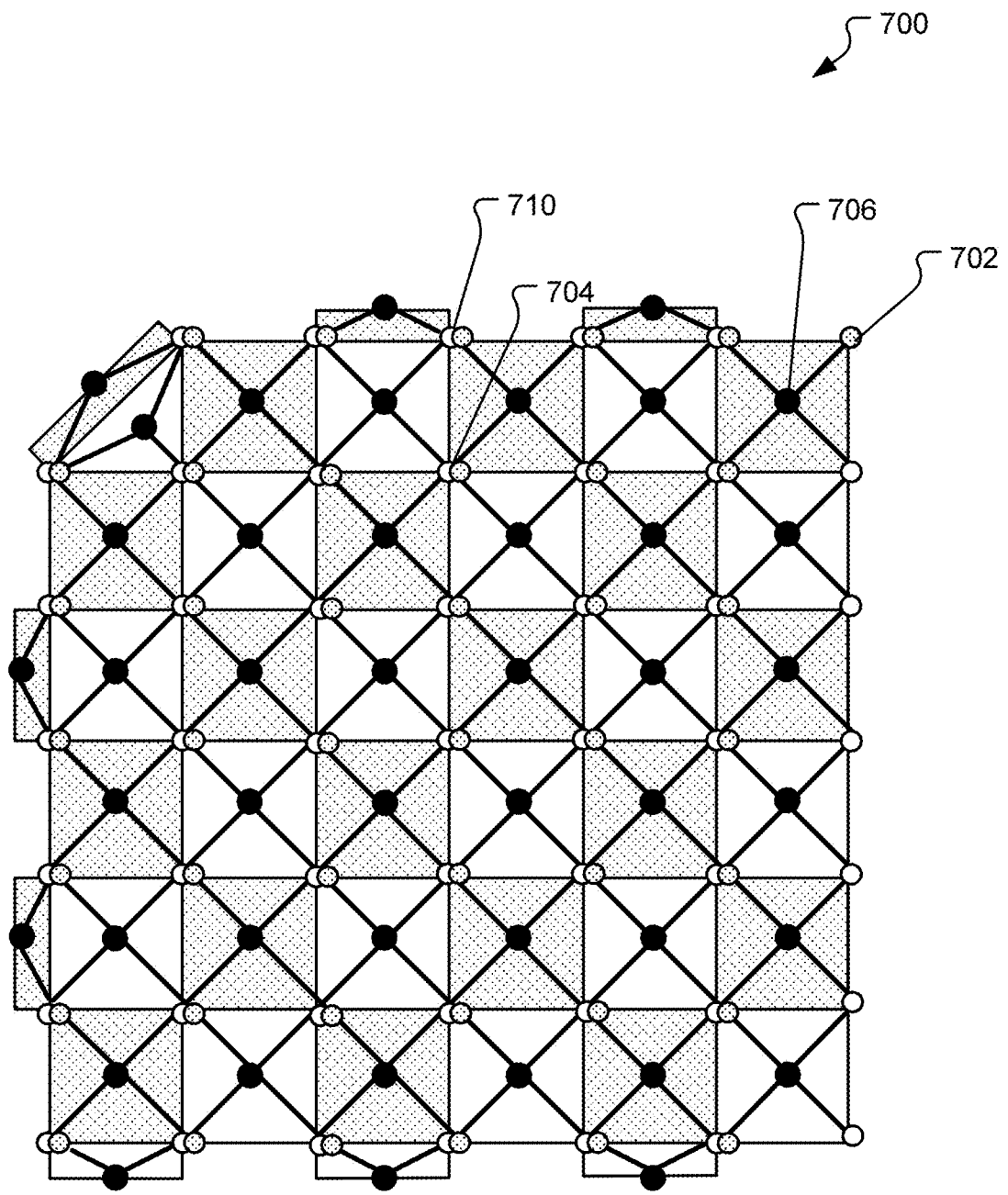
FIG. 7 illustrates an exemplary folded decoding graph that may be used to provide a fault-tolerant implementation of the folded code.

For a fault-tolerant implementation of the folded code, it proves convenient to introduce a bipartite graph referred to herein as a folded decoding graph, such as that shown in FIG. 7.

Specifically, FIG. 7. illustrates an exemplary folded decoding graph 700 that may provide for a fault-tolerant implementation of the folded code when used with the herein-disclosed "folded code" implementations of the Union-Find decoder (discussed further below with respect to FIG. 9A-9E). The folded code includes two types of nodes—bit nodes or "B-nodes" and ancilla nodes or "check nodes." A "B-node" (bit node) is a node that may be understood as being occupied by either a single data qubit or a pair of data qubits. With exemplary reference to FIG. 7, a bit node 702 is occupied by a single data qubit, which may be understood as intersection the vertical center line 620 shown in FIG. 6A-6B across which the surface code patch is folded. In contrast, another bit node 704 is occupied by a pair of data qubits at the same site. Bit nodes are represented by hollow circles (e.g., individual circles or pairs of circles). In contrast, an "Check node" (ancilla node) is a node corresponding to a surface code plaquette supporting a stabilizer measurement. Ancilla nodes (check nodes) are represented by filled circles (e.g., a check node 706) at the center of each plaquette. A B-node is said to be "connected" to a check node if and only if the plaquette touches the check node site.

The folded decoding graph 700 is marginally different from, but conceptually identical to, the better known Tanner graph of a classical code that is discussed with respect to FIG. 2A-4B. In the Tanner code, a "B-node" is a bit (represented by a circle in FIG. 2A-4B) while a check node a parity check (represented by a square in FIG. 2A-4B) imposing a linear constraint on the bit nodes that are connected to the check node.

The classical code's parity check matrix is the adjacency matrix ($M_{ab}$) whose elements are $M_{ab}=1$ if the bit b participates in the check a and $M_{ab}=0$ otherwise. In FIG. 7, there exist two qubits per B-node (except on the folded line represented by the right-hand column) and two stabilizers per Check node.

The "distance" between any two B-node sites in the folded decoding graph is given by the number of edges in a shortest path between the two nodes, as provided by the folded decoding graph. For example, any two neighboring B-node sites (e.g., sites 704 and 710 are said to be distance two apart). Since the folded code is a CSS code in which logical Z and logical X are symmetric under the mirror symmetry, Z errors and X stabilizers are considered in the following discussion about the folded code.

Noise Model and Folded Distance

Notably, the noise model for folded code circuit implementations is different than that of unfolded code. In the folded code where there exist two qubits on many of the sites, it is unreasonable to assume that the two qubits on the same site suffer from noise independently from one another. Even if idling errors are independent for the two qubits sharing a single site, an on-site two qubit gate, such as that is used in the transversal implementation of logical H and S gates, can bring correlated noise to the two qubits on the same sites. If there is no error correlation across different sites, then a reasonable error model for the folded code presumes that the two qubits on a given site are subject to an arbitrary error.

Under this modified noise model, the meaningful code distance is not the naive code distance d but instead the number of sites (each of which contains one or two qubits) in a region |O| that a logical operator O is supported on, minimized over all nontrivial logical operators. Call the latter scenario the folded code distance $d_f = \min_{o \neq I} |O|$. As proven below in Table 3.0, the correlated error model introduced by the above-described folding (e.g., a folding in which errors maintain independence across different sites) does not reduce the order of error reduction (e.g., the effective distance of the code employed) provided that the syndrome measurements are perfect.

TABLE 3.0

Lemma: For all odd positive d (where d = surface code distance), $d_f = d$.
In fact, for any d ≥ 3 and any set of sites, if the distance (with respect to the folded decoding graph) between any pair of sites in the set is at most 2(d − 2), then the set does not support any nontrivial logical operator. This means that the correlated error model induced by the folding which maintains the independence only across different sites, does not reduce the order of error reduction (effective distance) at least if the syndrome measurements are perfect.
Proof: Every logical operator must contain a path in the folded decoding graph. Since any Z logical operator should anticommute with every representative of the X logical operator, we may choose the path to start from the bottom red line and end at the upper right red line of fig:folded-code-distance-proof(a). By continuity, the sequence must pass through the center vertical folding line.
Upon folding, the start and end points of the path lie on the dark red and green lines of fig:folded-code-distance-proof(b), respectively. The center vertical line is colored bright red in fig:folded-code-distance-proof(b). If the end point of the path is one of the top d − 1 sites of the green line, the path contains d sites because the y-coordinates vary from 1 to d. If the end point of the path is one of the right d − 1 sites of the green line, the path contains ≥ d sites because the x-coordinates vary from 1 to d. In any case, the length of the path exceeds 2(d − 2). This completes the proof.

Figure 8:
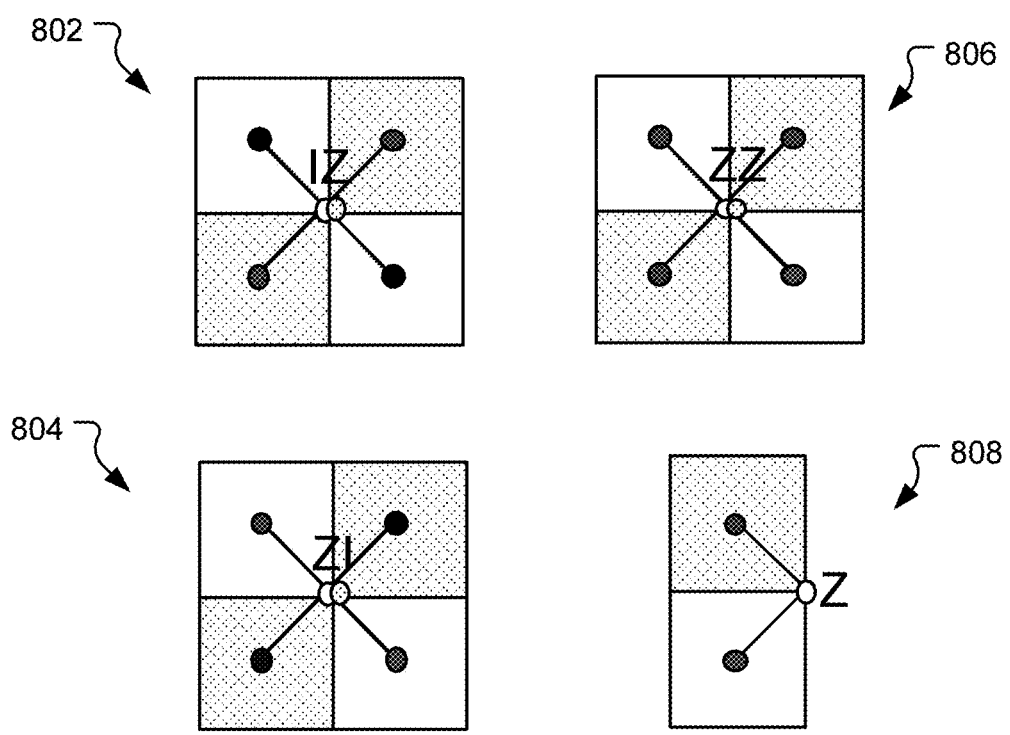
FIG. 8 illustrates examples depicting aspects of stabilizer measurements in the folded code.

FIG. 8 illustrates examples 802, 804, 806, and 808 depicting aspects of stabilizer measurements in the folded code. As explained above, bit nodes may contain either a pair of qubits (as in the center node shown in the examples of 802, 804, 806), or a singular qubit (as in the example of 808). In the examples of 802, 804, and 806, each pair of B-node qubits is represented by a shaded circle and a solid circle, referred to below as the "shaded qubit" and the "unshaded qubit," respectively. A Z-error occurring on the unshaded qubit at a B-node site is detected by a non-trivial stabilizer measurement at an Check node positioned on one of the neighboring unshaded plaquettes. In contrast, a Z error occurring on the shaded qubit at a B-node site is detected by a non-trivial stabilizer measurement at an Check node positioned on one of the neighboring shaded plaquettes. Along the fold (e.g., the central vertical line 620 in FIG. 6A-6B), single-qubit sites are shown as bi-colored (half shaded, half unshaded). At these locations, a Z error is detected on all incident plaquettes.

Decoder

Under the natural error model in a folded code, a t-site error (e.g., error at a bit node site) can be incorrectly decoded if a decoder adopted for an unfolded surface code is naively adopted. This is because any t-site error may be supported on 2t qubits. Below, a folded-code implementation of the Union Find decoder is presented that guarantees that any error that acts on t sites is correctly decoded whenever error occurs on a maximum number of sites t, where t≤(d−1)/2 (and d is the distance of the surface code). In what follows, a cluster is defined by a set of nodes and any edge that connects two nodes in the cluster that is automatically included (e.g., similar to that described above with respect to decoding methodologies for standard LDPC codes).

Notably, FIG. 9A-9D discuss a decoding process for correcting Z-type errors the using X measurements. The same correction procedure applies, by symmetry, to correct X errors using Z measurements.

Figure 9A:
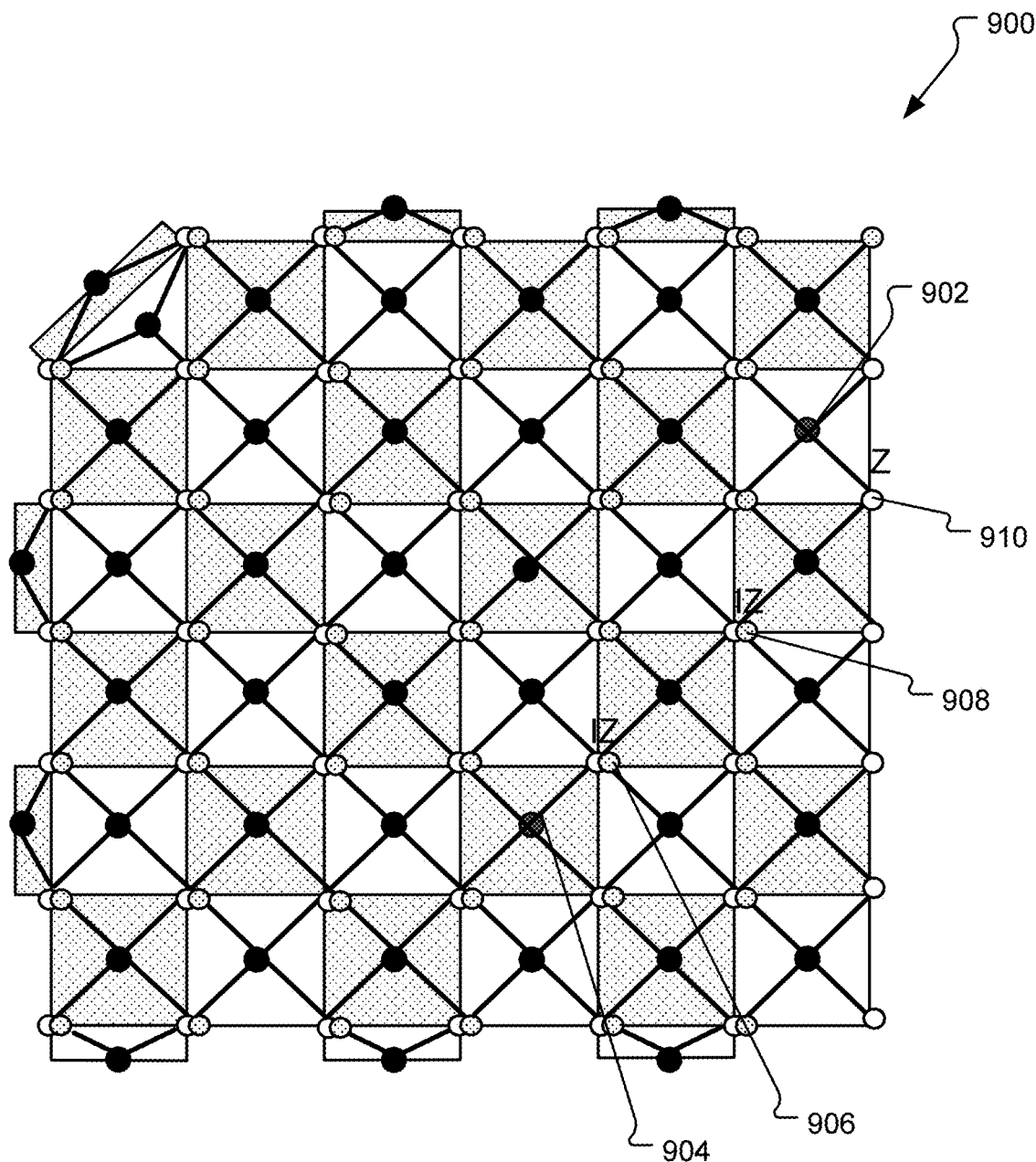
FIG. 9A illustrates a folded decoding graph illustrating an example syndrome measured in the X-basis that provides information about the locations of Z-type errors.

FIG. 9A illustrates an example folded decoding graph 900 similar to FIG. 7 above illustrating an example syndrome measured in the X-basis that provides information about the locations of Z-type errors (faults). By example and without limitation, the syndrome includes two non-trivial syndrome bits at check nodes 902 and 904 (on measure-X plaquettes) that provide information about Z-type faults that actually occur at bit node sites 906, 908, and 910. Upon receiving the measured syndrome, the Union-Find decoder begins a decoding process by growing a cluster around each of these non-trivial check nodes.

Figure 9B:
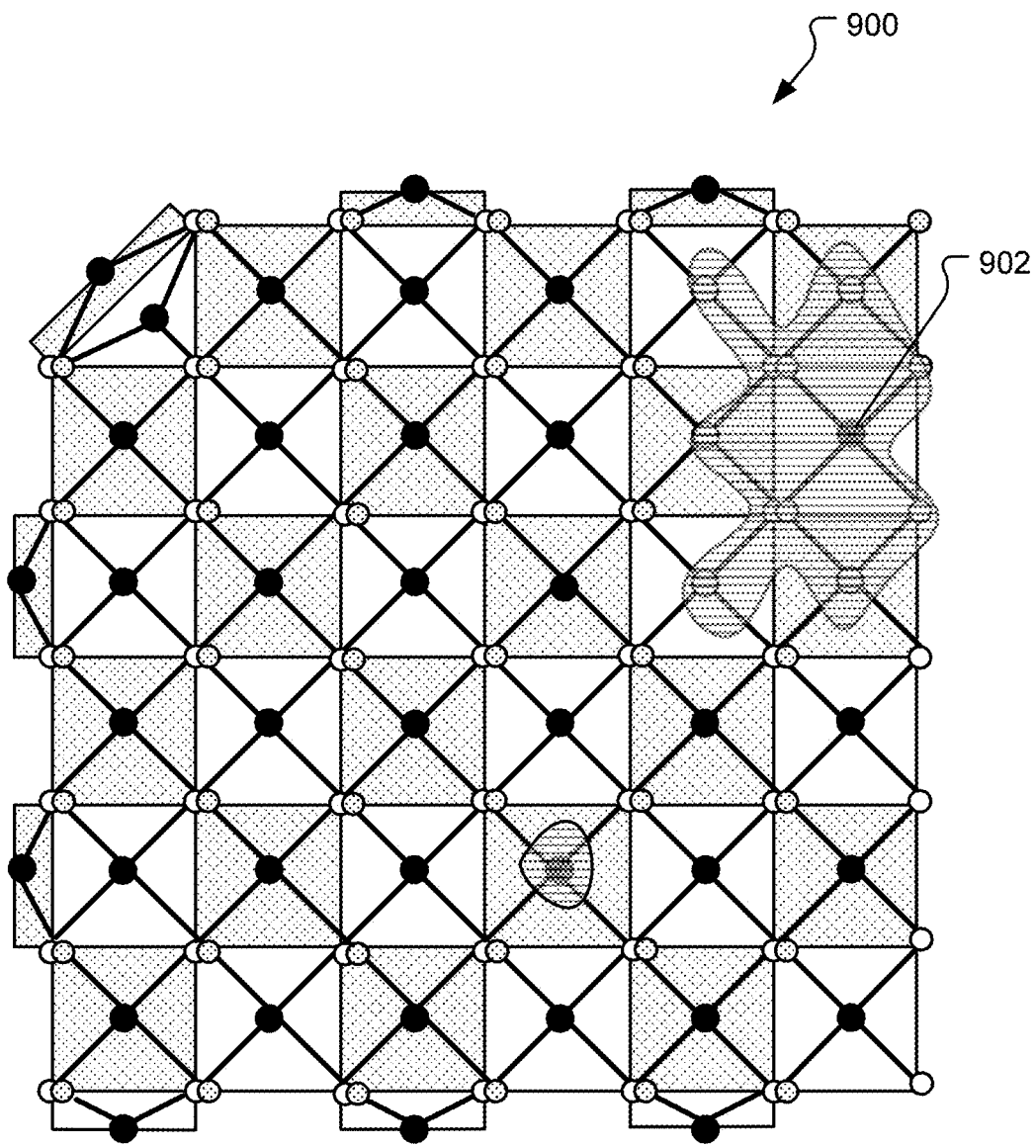
FIG. 9B illustrates example operations in a decoding process that is based on the folding decoding graph of FIG. 9A.

FIG. 9B illustrates example operations in a decoding process that is based on the folding decoding graph of FIG. 9A. In this decoding process, the Union-Find decoder grows a cluster 912 around the non-trivial node 902. This cluster 912 is initially defined to include the set of all nodes (bit nodes and check nodes) in the folded decoding graph 900 that are positioned within a maximum distance of two edge lengths from the cluster origin (the non-trivial node 902). (Note: this growth step is different than that described with respect to the LDPC-type Union-Find decoder, whereby initial clusters are grown to include nodes within one edge length of the non-trivial syndrome bit).

Figure 9C:
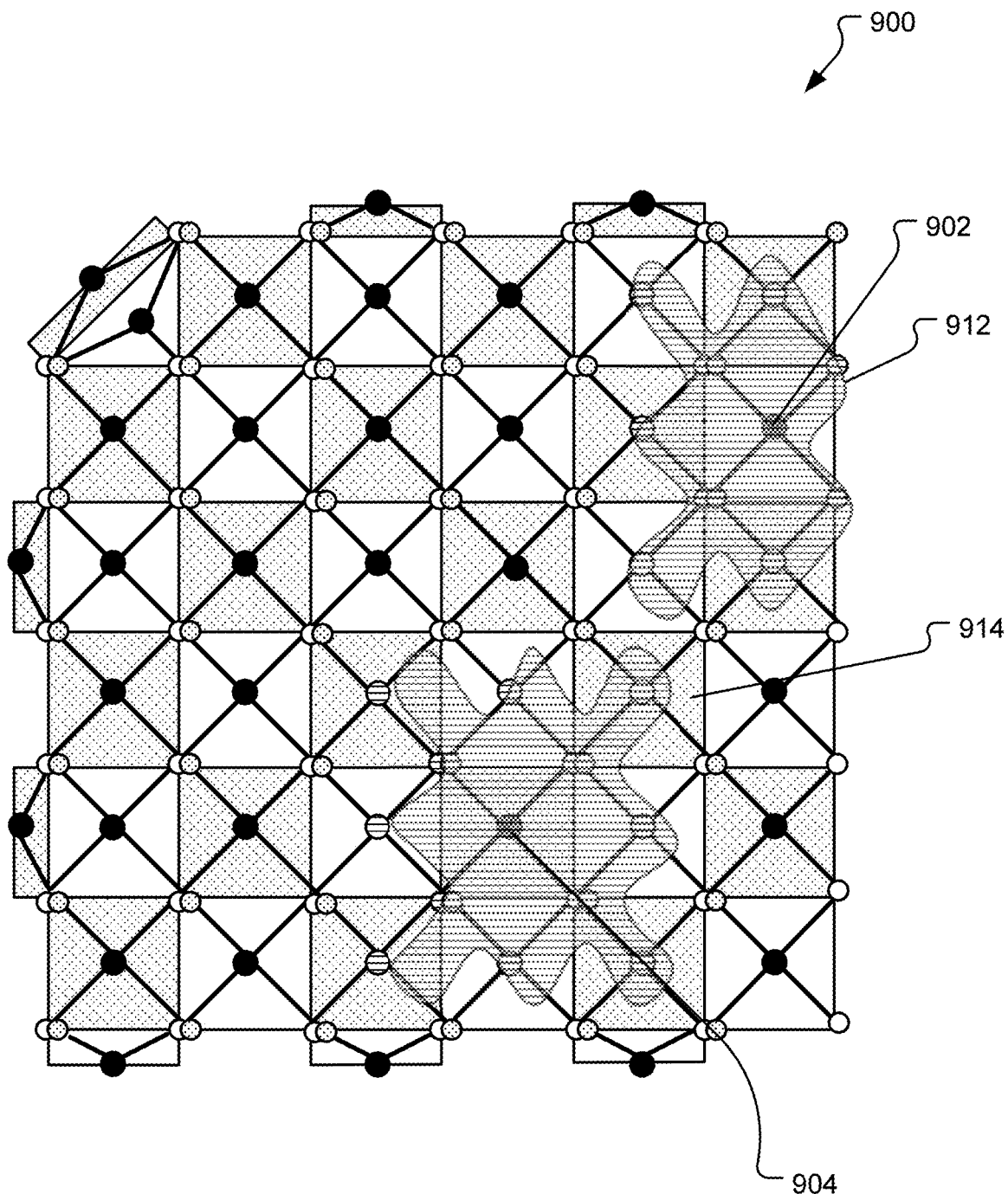
FIG. 9C illustrates further example operations in the decoding process of FIG. 9A-9B following the example operations described with respect to FIG. 9A-9B.

FIG. 9C illustrates further example operations in the decoding process of FIG. 9A-9B in which the Union-Find decoder grows another cluster 914 around the non-trivial node 904. Again, this cluster 914 is initially defined to include the set of all nodes (bit nodes and check nodes) that are positioned within a maximum distance of two edge lengths from the cluster origin (the non-trivial node 904).

The cluster growth steps shown in FIGS. 9B and 9C may, in various implementations, be performed either sequentially or concurrently.

If the cluster growth steps described above with respect to FIGS. 9B and 9C make two or more clusters meet (e.g., share one or more nodes), the Union-Find decoder may, at that time, merge together these clusters so there exists a single defined cluster instead of the multiple different clusters with one or more shared nodes.

The Union-Find decoder now performs a check to determine whether all clusters are neutral. Consistent with the definitions given for the LDPC Union-Find decoder, a cluster grown on the folded decoding graph is said to be "neutral" when there exists a correction entirely internal to the nodes of the cluster that fully explains the non-trivial syndrome nodes connected to the cluster. This definition of "neutral" has slightly different implications with respect to folded code than with respect to non-folded LDPC codes. To determine whether or not a cluster within the folded decoding graph 900 is neutral, the UF decoder performs the following operations:
1. Logically generate the "unfolded" counterpart of the folded decoding graph 900.
2. For each cluster in the unfolded version of the decoding graph, determine:
   (A) whether the cluster includes a boundary node (e.g., a qubit node of degree 1) and
   (B) whether the cluster contains an even number of non-trivial check nodes.

In step (2) of the above, if either (A) or (B) is true for one of the clusters 912, 914, the cluster is said to be "neutral." This is proven below in Table 4.0.

TABLE 4.0

Lemma: A connected cluster C of the unfolded decoding graph is neutral if and only if either C contains a boundary node (a qubit node of degree 1) or if C contains an even number of non-zero syndrome bits.
Let us describe a Union-Find decoder for the folded code. The algorithm takes as an input the set of plaquette nodes with non-trivial syndrome bits s for a Z error $E_Z$. It returns an estimation E' of $E_Z$. Specifically, the decoder:
1. Create a charged cluster $C_v$, = {v} of the folded decoding graph for each v ∈ s.
2. While there exists a charged cluster, the decoder performs the following operations:
a. Pick any one charged cluster C, and add all the nodes within distance 2 from C to C. If this growth makes two or more clusters meet, merge them. Check if the grown-merged cluster has become neutral.
3. All clusters are now neutral. For each cluster C, run the peeling subroutine with input syndrome $\varphi^{-1}(s)$ on the cluster preimage $\varphi^{-1}(C)$. The aggregate of the results from the peeling subroutine is E'.

Figure 9D:
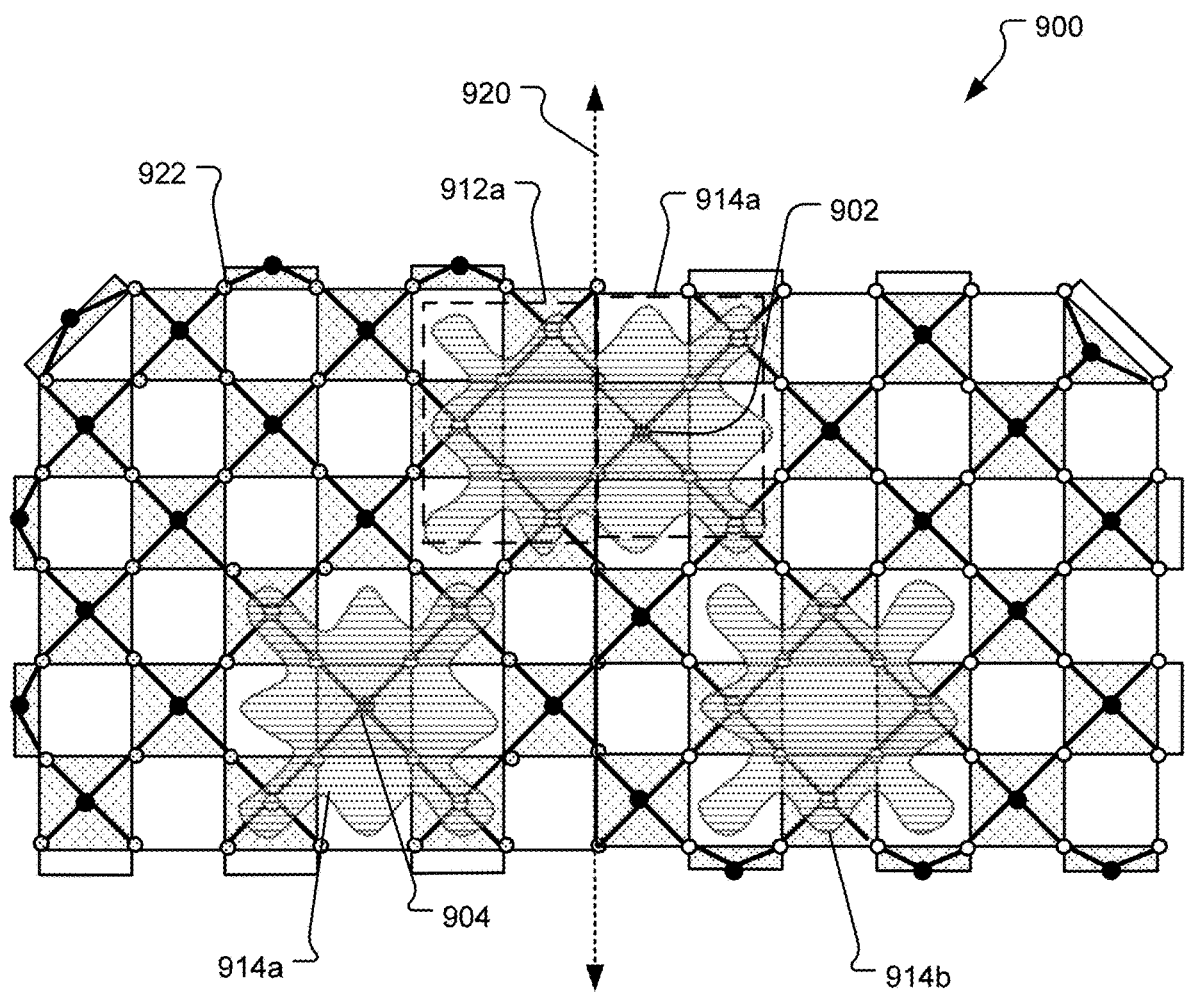
FIG. 9D illustrates an example unfolded configuration of the folded decoding graph shown in FIG. 9A-9C.

To conceptually illustrate this process, FIG. 9D illustrates an unfolded counterpart that corresponds to the folded decoding graph 900 shown in FIG. 9A-9C. Here, it is easier to see that the check nodes sites correspond to measure-X (shaded) plaquettes. The cluster 912 includes counterparts 912a, 912b which reflect over central line of symmetry 920. The cluster 914, in contrast, includes counterparts 914a, 914b which reflect over the central line of symmetry 920.

In this example, neither of the clusters 912, 914 include a boundary node in the graph that represents the logical qubit (e.g., boundary nodes are along outer edges of the graph, such as boundary node 922). Additionally, neither of the cluster 912, 914, includes an even number of non-trivial check nodes.

Due to the above, the Union-Find decoder determines that neither of the clusters 912, 914 is neutral. Both remain charged and the decoding process continues. Note—this outcome is procedurally identical (e.g., the decoding process continues) unless all clusters are determined to be neutral.

Figure 9E:
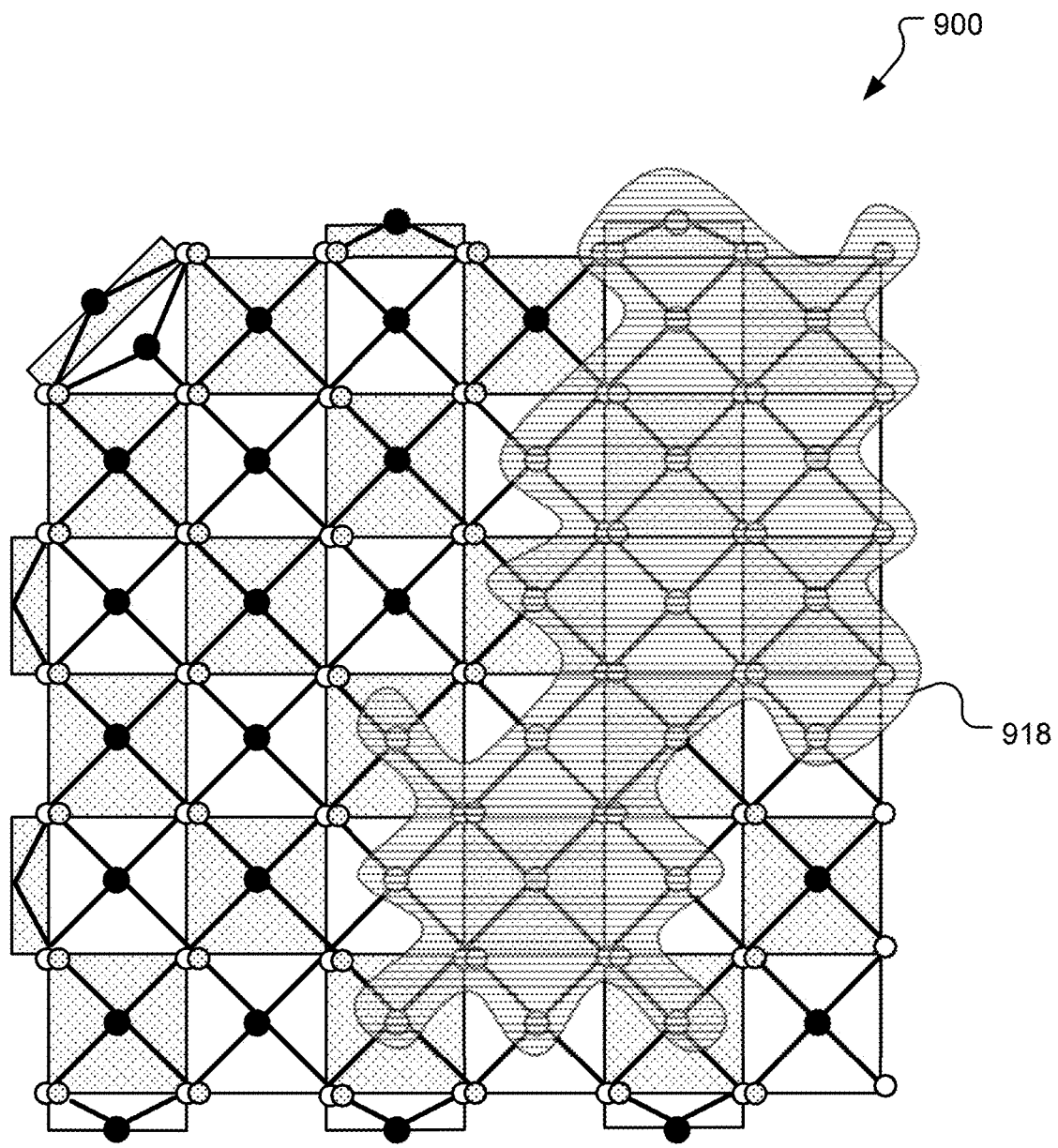
FIG. 9E illustrates an example cluster growth step that is performed in the decoding process of FIG. 9A-9D following the example operations described with respect to FIG. 9A-9D.

FIG. 9E illustrates a cluster growth step that is performed following the example operations of FIG. 9A-9D due to the existence of one or more remaining charged clusters resulting from the previous decoding operations. In the continued decoding process, the Union-Find decoder performs another cluster growth operation that is shown and described with respect to FIG. 9E. Specifically, FIG. 9E illustrates a cluster growth step that is performed following the operations of FIG. 9A-9D due to the existence of one or more remaining charged clusters resulting from the previous decoding operations. In this step, the cluster 912 is grown to include the set of nodes within a distance of 2-edge lengths from the boundary of the cluster. Stated differently, the clusters are each grown to include all nodes that are within a distance of 2 edges from nodes already included in the cluster. When the cluster 912 (shown in FIGS. 9C and 9D) is grown in this way, it merges with the cluster 914, resulting in a single cluster 918.

In different implementations, the cluster 914 may or may not also be grown in the same way before the UF decoder determines whether or not all clusters are neutral. At the cluster growth step shown in FIG. 9E, the merged cluster (including cluster 912 after expansion and cluster 914 prior to expansion) is neutral because the cluster now includes an even number of non-trivial syndrome bits. Due to a mathematical proof included below in Table 5.0, this means that the decoding algorithm applied by the Union Find decoder is capable of correcting this error.

TABLE 5.0

Proposition: The above-described decoding algorithm corrects any error on the folded code which is supported on t ≤ (d − 1)/2 sites, if syndrome measurements are perfect.
Proof. Let $E_Z$ be an input error on t sites of the folded code where t ≤ (d − 1)/2. At each growth step, a charged cluster C in the folded decoding graph is selected. If the cluster is charged there must exist at least one neighbor of C in the folded decoding graph which supports an error. As a result during each growth step, at least one site supporting an error is added to the cluster. Denote by g the number of growth steps in the algorithm. We have proved that g ≤ t and $E_Z$ contains at most t − g sites outside the final set of clusters.
Let $C_1(T), \ldots, C_m(T)$ be all clusters after T ≥ 0 growth steps. Let $S_j(T)$ be the set of all site nodes of $C_j(T)$. We consider the diameter of $S_j(T)$ and let δ(T) be the sum of all these diameters. When T = 1, exactly one cluster has grown and hence δ(T = 1) = 2. (Recall that the site support When a cluster grows, δ increases by at most 4, i.e., δ(T + 1) ≤ δ(T) + 4, of a plaquette has diameter 2.) whether that cluster grows in isolation or becomes merged with another cluster. Therefore, δ(T = g) ≤ 4g − 2.
The peeling subroutine produces an estimate E'' for the error which is included in the final clusters. Since the error $E_Z$ contains at most t − g sites with errors outside these clusters, each connected component of the residual error E'$E_Z$ after correction has diameter at most 4g − 2 + 2(t − g) = 2t + 2g − 2 ≤ 4t − 2 ≤ 2(d − 2). By the proof set forth in Table 3.0, the residual error is a stabilizer.

Figure 10:
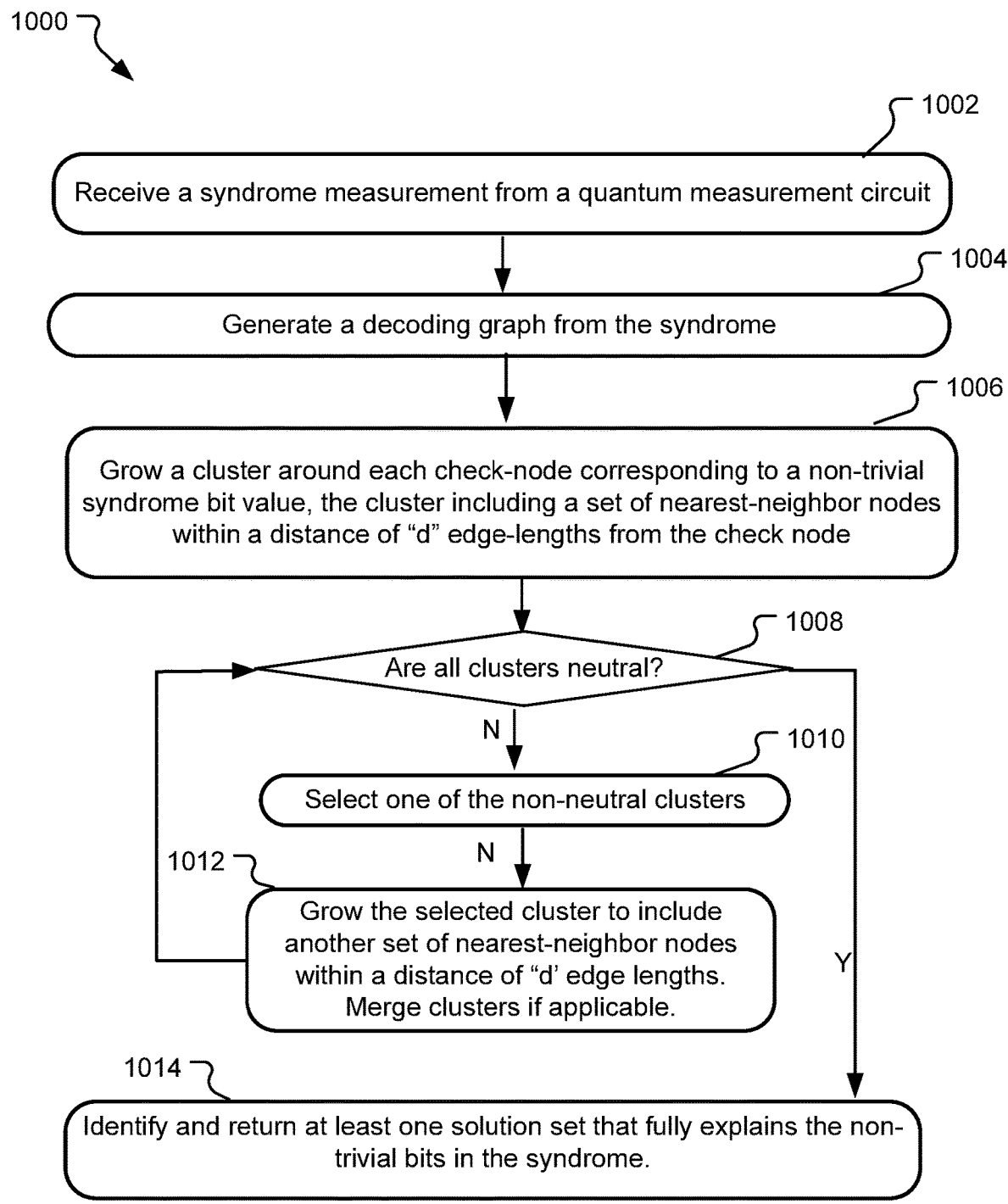
FIG. 10 illustrates example operations for fault detection using implementations of a Union-Find decoder.

FIG. 10 illustrates example operations 1000 for fault detection using either implementation of the Union-Find decoder disclosed herein. A receiving operation 1002 receives a syndrome measurement from a quantum measurement circuit. The measurement includes an array of syndrome bit value representing either Z checks (for detecting X-type faults) or X checks (for detecting Z-type faults).

A decoder graph generation operation 1004 generates a decoding graph from the received syndrome. The graph has bit nodes that each correspond to one or more data qubits in the measurement circuit and check nodes that each correspond to one of the syndrome bits. A cluster growth operation 1006 grows a cluster around each of the check-nodes corresponding to a non-trivial bit value. Each newly-grown cluster is defined to include the check nodes and a set of neighboring nodes that are positioned on the decoding graph within a distance of "d" edge lengths from the check node. Here, "d" is a predefined value that depends upon the type of error correction code that the system employs. For standard LDPC applications, "d" may be defined as being one edge length. In instances where folded code is used, "d" may be defined as being two edge lengths.

After the initial growth of clusters for all non-trivial bit values in the syndrome, a determination operation 1010 determines whether all clusters are neutral, as discussed herein with respect to Algorithm 1 for LDPC codes or, alternatively, per the methodology discussed above with respect to FIG. 9B and Table 4.0 for folded codes.

If the determination operation 1010 determines that all clusters are neutral, a fault detection operation 1014 identifies and returns at least one solution set (e.g., providing a solution for each cluster) that fully explains all of the non-trivial bits in the syndrome. If one or more clusters are found to be charged (non-neutral at the determination operation 1008), a selection operation 1010 selects one of the non-neutral clusters and grows the cluster to include another set of neighboring nodes that are within a distance of "d" edge-lengths from the cluster boundary, where 'd' is a predetermined number of edge-lengths (e.g., either 1 or 2) as described above. The determination operation 1008 again determines whether all clusters are neutral and, if not, the process continues through this loop until all clusters are found to be neutral and the solution set is returned by the fault detection operation 1014.

Figure 11:
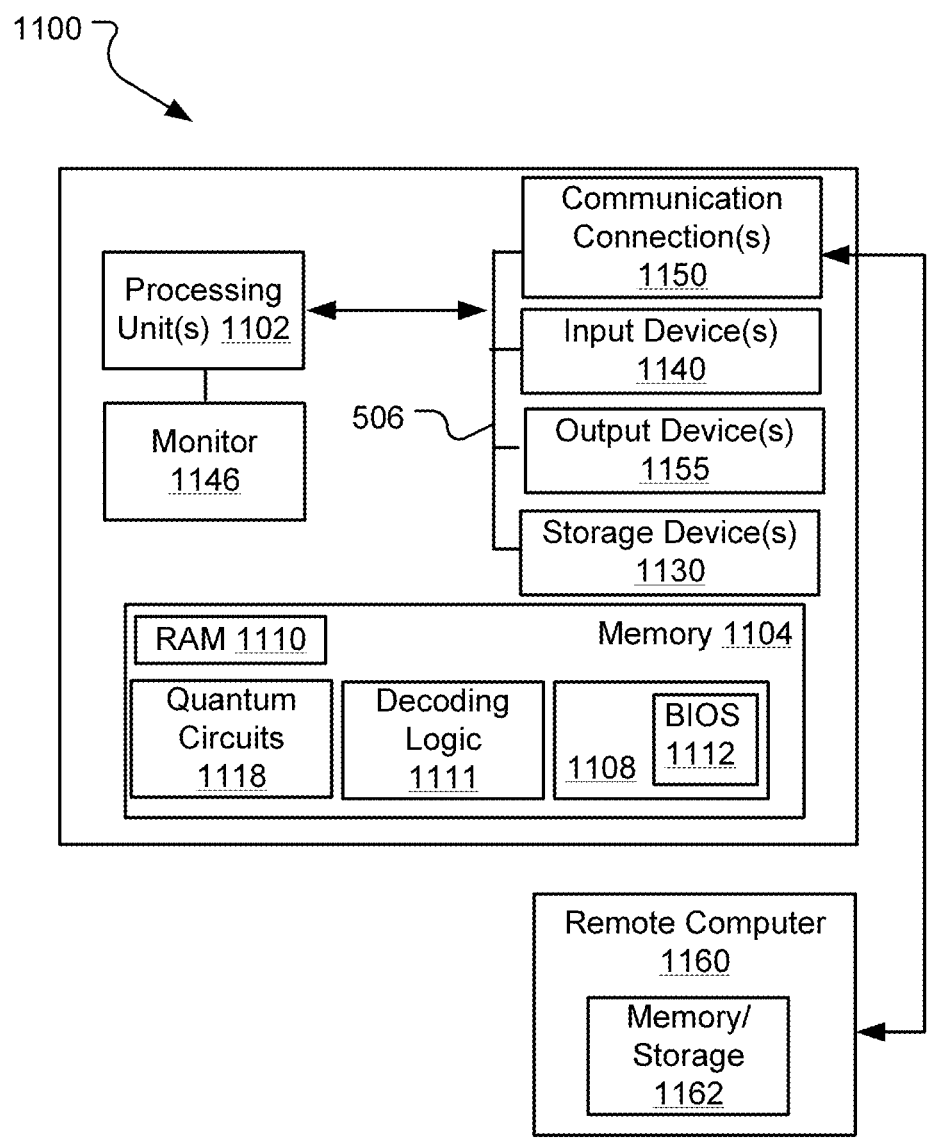
FIG. 11 illustrates an exemplary computing environment suitable for implementing aspects of the disclosed technology.

FIG. 11 and the following discussion are intended to provide a brief, general description of an exemplary computing environment in which the disclosed technology may be implemented. Although not required, the disclosed technology is described in the general context of computer executable instructions, such as program modules, being executed by a personal computer (PC). Generally, program modules include routines, programs, objects, components, data structures, etc., that perform particular tasks or implement particular abstract data types. Moreover, the disclosed technology may be implemented with other computer system configurations, including hand held devices, multiprocessor systems, microprocessor-based or programmable consumer electronics, network PCs, minicomputers, mainframe computers, and the like. The disclosed technology may also be practiced in distributed computing environments where tasks are performed by remote processing devices that are linked through a communications network. In a distributed computing environment, program modules may be located in both local and remote memory storage devices. Typically, a classical computing environment is coupled to a quantum computing environment, but a quantum computing environment is not shown in FIG. 11.

With reference to FIG. 11, an exemplary system for implementing the disclosed technology includes a general purpose computing device in the form of an exemplary conventional PC 1100, including one or more processing units 1102, a system memory 1104, and a system bus 1106 that couples various system components including the system memory 1104 to the one or more processing units 1102. The system bus 1106 may be any of several types of bus structures including a memory bus or memory controller, a peripheral bus, and a local bus using any of a variety of bus architectures. The exemplary system memory 504 includes read only memory (ROM) 1108 and random access memory (RAM) 1110. A basic input/output system (BIOS) 1112, containing the basic routines that help with the transfer of information between elements within the PC 1100, is stored in ROM 1208.

In on implementation, the system memory 1104 stores decoding logic 1111, such as QECCs and logic specifically implemented by various system decoders (e.g., the union-find decoder of FIG. 1).

The exemplary PC 1100 further includes one or more storage devices 1130 such as a hard disk drive for reading from and writing to a hard disk, a magnetic disk drive for reading from or writing to a removable magnetic disk, and an optical disk drive for reading from or writing to a removable optical disk (such as a CD-ROM or other optical media). Such storage devices can be connected to the system bus 1106 by a hard disk drive interface, a magnetic disk drive interface, and an optical drive interface, respectively. The drives and their associated computer readable media provide nonvolatile storage of computer-readable instructions, data structures, program modules, and other data for the PC 1100. Other types of computer-readable media which can store data that is accessible by a PC, such as magnetic cassettes, flash memory cards, digital video disks, CDs, DVDs, RAMs, ROMs, and the like, may also be used in the exemplary operating environment.

A number of program modules may be stored in the storage devices 1130 including an operating system, one or more application programs, other program modules, and program data. Decoding logic can be stored in the storage devices 1130 as well as or in addition to the memory 1104. A user may enter commands and information into the PC 1100 through one or more input devices 1140 such as a keyboard and a pointing device such as a mouse. Other input devices may include a digital camera, microphone, joystick, game pad, satellite dish, scanner, or the like. These and other input devices are often connected to the one or more processing units 1102 through a serial port interface that is coupled to the system bus 1106, but may be connected by other interfaces such as a parallel port, game port, or universal serial bus (USB). A monitor 1146 or other type of display device is also connected to the system bus 1106 via an interface, such as a video adapter. Other peripheral output devices 1145, such as speakers and printers (not shown), may be included.

The PC 1100 may operate in a networked environment using logical connections to one or more remote computers, such as a remote computer 1160. In some examples, one or more network or communication connections 1150 are included. The remote computer 1160 may be another PC, a server, a router, a network PC, or a peer device or other common network node, and typically includes many or all of the elements described above relative to the PC 1100, although only a memory storage device 1162 has been illustrated in FIG. 11. The personal computer 1100 and/or the remote computer 1160 can be connected to a logical a local area network (LAN) and a wide area network (WAN). Such networking environments are commonplace in offices, enterprise wide computer networks, intranets, and the Internet.

When used in a LAN networking environment, the PC 1100 is connected to the LAN through a network interface. When used in a WAN networking environment, the PC 1100 typically includes a modem or other means for establishing communications over the WAN, such as the Internet. In a networked environment, program modules depicted relative to the personal computer 1100, or portions thereof, may be stored in the remote memory storage device or other locations on the LAN or WAN. The network connections shown are exemplary, and other means of establishing a communications link between the computers may be used.

A method disclosed herein includes receiving a syndrome from a quantum measurement circuit, where the syndrome includes a plurality of syndrome bits providing information about one or more errors in a qubit register. The method further comprises generating a decoding graph from the syndrome, where the graph has bit nodes that each correspond to one or more data qubits in the measurement circuit and check nodes that each correspond to one of the syndrome bits. A cluster is grown around each one of the check nodes corresponding to a non-trivial value in the syndrome, where the cluster includes the check node and a set of neighboring nodes positioned within a distance of d edge-lengths from the check node. The method further comprises determining if each of the clusters is neutral. A cluster is determined to be neutral when there exists a solution set internal to the cluster that fully explains the non-trivial syndrome bit for the cluster. Responsive to determining that all of the clusters are neutral, at least one solution set is identified and returned. The solution set fully explains the set of non-trivial bits in the syndrome.

In an example method of any preceding method, the method further comprises merging together clusters that contain neighboring nodes responsive to determining that more than one or more of the clusters is non-neutral.

In another example method of any preceding method, the method further comprises growing each one of the clusters to include an additional set of nodes positioned within the maximum distance of d edge-lengths from a boundary of the cluster; determining if each one of the clusters is neutral following the growing operation; and identifying and returning the at least one solution set that fully explains the set of non-trivial bits in the syndrome responsive to determining that all of the clusters are neutral.

In yet another example method of any preceding method, the quantum measurement circuit implements a surface code and the distance of d edge-lengths consists of one edge.

In still another example method of any preceding method, the quantum measurement circuit implements a folded code and the distance of d edge-lengths consists of two edges.

In another example method of any preceding method, the quantum measurement circuit implements a hexon architecture that includes a pair of data qubits at each of multiple physical sites.

In yet still another example method of any preceding method, each of multiple physical sites include a pair of qubits connected by interaction channels.

In still another example method of any preceding method, the qubit register includes logical qubits encoded in an LDPC code that is built from physical qubits.

An example a quantum system comprises a quantum measurement circuit configured to measure a syndrome encoded on a grid of qubits and a decoder stored in memory. The decoder is executable to generate a decoding graph based on the syndrome, where the decoding graph has bit nodes that each correspond to one or more data qubits on the grid and check nodes that each correspond to one of a plurality of syndrome bits in the measured syndrome. The decoder then grows a cluster around each one of the check nodes that corresponds to a non-trivial value in the measured syndrome. The cluster includes the check node and a set of neighboring nodes positioned within a distance of d edge-lengths from the check node. The decoder determines if each of the clusters is neutral. Responsive to determining that all of the clusters are neutral, the decoder identifies and returns at least one solution set that fully explains the set of non-trivial bits in the syndrome.

In an example system of any preceding system, the decoder is further executable to merge together clusters that contain one or more neighboring nodes responsive to determining than one or more of the clusters is non-neutral.

In yet still another example system of any preceding system, the decoder is further executable to grow each one of the clusters to include an additional set of nodes positioned within the distance of d edge-lengths from the cluster responsive to determining that one or more of the independent clusters are non-neutral; determine if each one of the clusters is neutral following the growing operation; and responsive to determining that all of the clusters are neutral, identify and return the at least one solution set that fully explains the set of non-trivial bits in the syndrome.

In another example system of any preceding system, the quantum measurement circuit implements a surface code and the distance of d edge-lengths consists of one edge.

In yet still another example system of any preceding system, the quantum measurement circuit implements a folded code and the distance of d edge-lengths consists of two edges.

In still another example system of any preceding system, the quantum measurement circuit implements a Majorana hexon architecture that includes a pair of data qubits at each of multiple physical qubit sites.

In yet another example system of any preceding system, each of multiple physical sites includes a pair of qubits connected by interaction channels.

An example memory device disclosed herein encodes computer-executable instructions for executing a computer process. The computer process comprises receiving a syndrome from a quantum measurement circuit, where the syndrome includes a plurality of syndrome bits providing information about one or more errors in a qubit register. The computer process further comprises generating a decoding graph from the syndrome, where the decoding graph has bit nodes that each correspond to one or more data qubits in the measurement circuit and check nodes that each correspond to one of the syndrome bits. The computer process still further comprises growing a cluster around each one of the check nodes corresponding to a non-trivial value in the syndrome, where the cluster includes the check node and a set of neighboring nodes positioned within a distance of d edge-lengths from the check node. Finally, the computer process also comprises and, responsive to determining that all of the clusters are neutral, identifying and returning at least one solution set that fully explains the set of non-trivial bits in the syndrome.

In an example memory device of any preceding memory device, the encoded computer process further comprises merging together clusters that contain one or more neighboring nodes responsive to determining than one or more of the clusters is non-neutral.

In still another example memory device of any preceding memory device, the encoded computer process further comprises growing each one of the clusters to include an additional set of nodes positioned within the distance of d edge-lengths from the cluster responsive to determining that one or more of the independent clusters are non-neutral; determining if each one of the clusters is neutral following the growing operation; and identifying and returning the at least one solution set that fully explains the set of non-trivial bits in the syndrome responsive to determining that all of the clusters are neutral.

In still another example memory device of any preceding memory device, the quantum measurement circuit implements a surface code and the distance of d edge-lengths consists of one edge.

In yet still another example memory device of any preceding memory device, the quantum measurement circuit implements a folded code and the distance of d edge-lengths consists of two edges.

An example system disclosed herein includes a means for receiving a syndrome from a quantum measurement circuit, where the syndrome includes a plurality of syndrome bits providing information about one or more errors in a qubit register. The system further comprises a means for generating a decoding graph from the syndrome where the graph has bit nodes that each correspond to one or more data qubits in the measurement circuit and check nodes that each correspond to one of the syndrome bits. The system further comprises a means for growing a cluster around each one of the check nodes corresponding to a non-trivial value in the syndrome, where the cluster includes the check node and a set of neighboring nodes positioned within a distance of d edge-lengths from the check node. The system further includes a means for determining if each of the clusters is neutral and, responsive to determining that all of the clusters are neutral, identifying and returning at least one solution set that fully explains the set of non-trivial bits in the syndrome.

The above specification, examples, together with the attached appendix provide a complete description of the structure and use of exemplary implementations. Since many implementations can be made without departing from the spirit and scope of the claimed invention, the claims hereinafter appended define the invention. Furthermore, structural features of the different examples may be combined in yet another implementation without departing from the recited claims. The above specification, examples, and data provide a complete description of the structure and use of exemplary implementations. Since many implementations can be made without departing from the spirit and scope of the claimed invention, the claims hereinafter appended define the invention. Furthermore, structural features of the different examples may be combined in yet another implementation without departing from the recited claims.

What is claimed is:

1. A method comprising:
    receiving a syndrome from a quantum measurement circuit, the syndrome including a plurality of syndrome bits providing information about one or more errors in a qubit register; and
    generating a decoding graph from the syndrome, the graph having bit nodes that each correspond to one or more data qubits in the measurement circuit and check nodes that each correspond to one of the syndrome bits;
    growing a cluster around each one of the check nodes corresponding to a non-trivial value in the syndrome, the cluster including the check node and a set of neighboring nodes positioned within a distance of d edge-lengths from the check node;
    determining if each of the clusters is neutral, the cluster being neutral when there exists a solution set internal to the cluster that fully explains the non-trivial syndrome bit for the cluster; and
    responsive to determining that all of the clusters are neutral, identifying and returning at least one solution set that fully explains the set of non-trivial bits in the syndrome.

2. The method of claim 1, further comprising:
    responsive to determining than one or more of the clusters is non-neutral, merging together clusters that contain neighboring nodes.

3. The method of claim 1, further comprising:
    responsive to determining that one or more of the clusters are non-neutral, growing each one of the clusters to include an additional set of nodes positioned within a maximum distance of d edge-lengths from a boundary of the cluster;
    determining if each one of the clusters is neutral following the growing operation;
    responsive to determining that all of the clusters are neutral, identifying and returning the at least one solution set that fully explains the set of non-trivial bits in the syndrome.

4. The method of claim 1, wherein the quantum measurement circuit implements a surface code and the distance of d edge-lengths consists of one edge.

5. The method of claim 1, wherein the quantum measurement circuit implements a folded code and the distance of d edge-lengths consists of two edges.

6. The method of claim 5, wherein the quantum measurement circuit implements a hexon architecture that includes a pair of data qubits at each of multiple physical sites.

7. The method of claim 5, wherein each of multiple physical sites include a pair of qubits connected by interaction channels.

8. The method of claim 1, wherein the qubit register includes logical qubits encoded in an LDPC code that is built from physical qubits.

9. A quantum system comprising:
    a quantum measurement circuit configured to measure a syndrome encoded on a grid of qubits;
    a decoder stored in memory and executable to:
        generate a decoding graph based on the syndrome, the decoding graph having bit nodes that each correspond to one or more data qubits on the grid and check nodes that each correspond to one of a plurality of syndrome bits in the measured syndrome;
        grow a cluster around each one of the check nodes that corresponds to a non-trivial value in the measured syndrome, the cluster including the check node and a set of neighboring nodes positioned within a distance of d edge-lengths from the check node;
        determine if each of the clusters is neutral, the cluster being neutral when there exists a solution set internal to the cluster that fully explains the non-trivial syndrome bit for the cluster; and
        responsive to determining that all of the clusters are neutral, identify and returning at least one solution set that fully explains the set of non-trivial bits in the syndrome.

10. The quantum system of claim 9, wherein the decoder is further executable to: merge together clusters that contain one or more neighboring nodes responsive to determining than one or more of the clusters is non-neutral.

11. The quantum system of claim 9, wherein the decoder is further executable to:
    grow each one of the clusters to include an additional set of nodes positioned within the distance of d edge-lengths from the cluster responsive to determining that one or more of the clusters are non-neutral;
    determine if each one of the clusters is neutral following the growing operation;

responsive to determining that all of the clusters are neutral, identify and return the at least one solution set that fully explains the set of non-trivial bits in the syndrome.

12. The quantum system of claim 9, wherein the quantum measurement circuit implements a surface code and the distance of d edge-lengths consists of one edge.

13. The quantum system of claim 9, wherein the quantum measurement circuit implements a folded code and the distance of d edge-lengths consists of two edges.

14. The quantum system of claim 13, wherein the quantum measurement circuit implements a Majorana hexon architecture that includes a pair of data qubits at each of multiple physical qubit sites.

15. The quantum system of claim 13, wherein each of multiple physical sites includes a pair of qubits connected by interaction channels.

16. One or more memory devices encoding computer-executable instructions for executing a computer process, the computer process comprising:
   receiving a syndrome from a quantum measurement circuit, the syndrome including a plurality of syndrome bits providing information about one or more errors in a qubit register; and
   generating a decoding graph from the syndrome, the graph having bit nodes that each correspond to one or more data qubits in the measurement circuit and check nodes that each correspond to one of the syndrome bits;
   growing a cluster around each one of the check nodes corresponding to a non-trivial value in the syndrome, the cluster including the check node and a set of neighboring nodes positioned within a distance of d edge-lengths from the check node;
   determining if each of the clusters is neutral, the cluster being neutral when there exists a solution set internal to the cluster that fully explains the non-trivial syndrome bit for the cluster; and
   responsive to determining that all of the clusters are neutral, identifying and returning at least one solution set that fully explains the set of non-trivial bits in the syndrome.

17. The one or more memory devices of claim 16, wherein the computer process further comprises:
   responsive to determining than one or more of the clusters is non-neutral, merging together clusters that contain one or more neighboring nodes.

18. The one or more memory devices of claim 16, wherein the computer process further comprises:
   responsive to determining that one or more of the clusters are non-neutral, growing each one of the clusters to include an additional set of nodes positioned within the distance of d edge-lengths from the cluster;
   determining if each one of the clusters is neutral following the growing operation;
   responsive to determining that all of the clusters are neutral, identifying and returning the at least one solution set that fully explains the set of non-trivial bits in the syndrome.

19. The one or more memory devices of claim 16, wherein the quantum measurement circuit implements a surface code and the distance of d edge-lengths consists of one edge.

20. The one or more memory devices of claim 16, wherein the quantum measurement circuit implements a folded code and the distance of d edge-lengths consists of two edges.

* * * * *